(12) United States Patent
Ohta et al.

(10) Patent No.: US 6,600,383 B2
(45) Date of Patent: Jul. 29, 2003

(54) RADIO-FREQUENCY COMPOSITE ELEMENT

(75) Inventors: Akira Ohta, Tokyo (JP); Akira Inoue, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/729,087

(22) Filed: Dec. 5, 2000

(65) Prior Publication Data

US 2002/0008595 A1 Jan. 24, 2002

(30) Foreign Application Priority Data

Jun. 30, 2000 (JP) ......................................... 2000-197554

(51) Int. Cl.[7] ................. H01P 1/32; H01P 1/36
(52) U.S. Cl. ................. 333/1.1; 333/24.2; 330/307
(58) Field of Search ................. 333/1.1, 24.2; 330/307

(56) References Cited

U.S. PATENT DOCUMENTS 5,945,887 A    8/1999  Makino et al. ............. 333/1.1
6,330,165 B1 * 12/2001 Kohjiro et al. ............. 361/760

FOREIGN PATENT DOCUMENTS

| JP | 9-270608  | 10/1997 | ........... H01P/1/383 |
| JP | 10-327003 | 12/1998 | ........... H01P/1/383 |

OTHER PUBLICATIONS

Conveyou, D., et al., "High Performance L–Band Ball Grid Array Power and Receive Amplifier Module Set for Satellite Phone Handsets", Mar. 16, 1999, IEEE MTT–S Digest, pp. 223–226.

* cited by examiner

Primary Examiner—Robert Pascal
Assistant Examiner—Stephen E. Jones
(74) Attorney, Agent, or Firm—Leydig, Voit & Mayer, Ltd.

(57) ABSTRACT

A radio-frequency composite element includes an element substrate carrying a high-efficiency amplifier, a transmission line, and an isolator. The amplifier is a semiconductor element mounted on a multilayer substrate and enveloped by a cover. The transmission line furnished on the element substrate connecting an output terminal of the high-efficiency amplifier with an input terminal of the isolator, so that the components make up an integral composite element.

16 Claims, 28 Drawing Sheets

106

200

PRIOR ART

RADIO-FREQUENCY COMPOSITE ELEMENT

BACKGROUND OF THE INVENTION

1. Field of the Invention

The present invention relates to a radio-frequency composite element having an amplifier and a nonreciprocal circuit element mounted integrally on a circuit board, the amplifier including a semiconductor amplifier such as an FET or a transistor arrangement or by a high-efficiency amplifier used particularly in mobile communication devices or microwave communication instruments.

2. Description of the Related Art

FIG. 28 schematically shows a conventional radio-frequency circuit device.

In FIG. 28, reference numeral 200 denotes a radio-frequency circuit device making up part of a transmitter used in radio equipment typically represented by a conventional portable terminal apparatus. Reference numeral 202 stands for an isolator; 204 for a high-efficiency amplifier; 204a for a main body of the high-efficiency amplifier; 204b for a cover that envelops the body 204a; 206 for a transmission line connecting the isolator 202 with the high-efficiency amplifier 204; and 208 for a circuit board. Although not shown, other circuit elements, in addition to the high-efficiency amplifier 204 and isolator 202, are also connected with the transmission line 206 on the circuit board 208.

Mobile communication devices utilize a nonreciprocal circuit element typically represented by the isolator 202 in order to operate the high-efficiency amplifier 204 efficiently regardless of the state of the antenna.

A signal is input through an input terminal (not shown) of the high-efficiency amplifier 204 and is amplified by the latter. The amplified signal is forwarded over the transmission line 206 and through the isolator 202 before being output from an output terminal (not shown) of the isolator 202. Any reflected wave from downstream of the output terminal of the isolator 202 is shielded by the latter and will not return to the high-efficiency amplifier 204. This allows the amplifier 204 to operate in a significantly efficient and stable manner.

Portable terminal apparatuses have been getting smaller and lighter than ever in recent years. Efforts to make things more compact and lightweight constitute an important factor in developing a portable terminal apparatus. A battery kit of the apparatus is a component that, if reduced in size, contributes significantly to making the portable terminal apparatus smaller and lighter.

However, the battery size can be reduced only so much; simply diminishing the battery dimensions will end up failing to ensure an adequate time period for making calls. Other circuit components must be made more efficient so as to save as much power as possible in the portable terminal apparatus. Of the remaining components, the amplifier consumes an appreciably large portion of power. It is thus important to boost the efficiency of the amplifier as part of the effort to reduce power dissipation.

Generally, the output impedance of the high-efficiency amplifier 204 is 50 ohms and so is the input impedance of the isolator 202. The characteristic impedance of the transmission line 206 between the two components is set to the 50-ohm level so as to minimize the line loss and to save power consumed by the high-efficiency amplifier 204.

As portable terminal apparatuses are getting thinner and smaller today, the circuit board 208 tends to be lessened in thickness correspondingly. If the characteristic impedance of the transmission line 206 were to be held at 50 ohms, the line 206 would have to be made narrower. This would lead to characteristic impedance variations of the transmission line 206 between different apparatuses. Such impedance variations, combined with deviations in the output impedance of the high-efficiency amplifier 204 and in the input impedance of the isolator 202, would disrupt impedance matching among the components. As a result, the line loss would increase and little saving could be made on the power dissipation of the high-efficiency amplifier 204.

The simplest solution to the above problem involves giving wider margins to the specifications of the high-efficiency amplifier 204, isolator 202, and the circuit board 208 including the transmission line 206. One disadvantage of the solution, however, is an increase of cost.

In this connection, circuit board designers have been prompted to work out a more accurate impedance design of the transmission line. The need to acquire such a design feature has prolonged the period of development.

Another solution to the problem described above is proposed in Japanese Patent Laid-open No. Hei 10-327003. This application discloses a setup in which an isolator with an impedance-matching circuit built therein is incorporated into a transmitting amplifier. An output terminal of an output amplifying element in the transmitting amplifier is connected to the isolator by way of a low-impedance transmission line. The setup helps enlarge a microstrip line regardless of the circuit board being made thinner so as to eliminate impedance mismatch, whereby the line loss is minimized.

This proposed setup still uses the ordinary circuit board. As one disadvantage of the setup, enlargement of the microstrip line, irrespective of the thin circuit board can impede efforts to reduce the surface area of the circuit board.

The isolator is mounted on the circuit board of the transmitting amplifier. Among the circuit components, the isolator has a prominent elevation and will suffer characteristic deterioration if reduced significantly in height. It follows that thinning the transmitting amplifier can be difficult to accomplish as long as the isolator incorporated in the transmitting amplifier is mounted on the latter's circuit board.

It may be added that demands are higher than ever for cellular phones working as portable terminal apparatuses to be smaller as well as thinner. Illustratively, of the mobile phones being marketed in Japan, some are as thin as 15 mm or even less. Every time a new model comes out, a millimeter or so is shaved off its thickness. This has entailed a strong demand for making thinner each of the components constituting the cellular phone. One of the thickest electronic parts mounted on the circuit board of the cellular phone is the isolator. At present, the isolator is about two millimeters thick. What is being demanded today is for the isolator thickness to be shaved in increments of 0.1 mm without degrading the electrical characteristics of the isolator.

Japanese Patent Laid-open No. Hei 9-270608 discloses a transmitter-receiver comprising a circuit having an isolator mounted on the amplifier output side.

Japanese Patent Laid-open No. 2000-58977 depicts an optical radio-frequency communication unit in which a low-speed control signal circuit and a radio-frequency signal circuit are mounted on separate circuit boards in a single package. The circuit boards are each equipped with a shield to prevent interference, and the radio-frequency signal circuit is designed to optimize its characteristic impedance to improve transmission characteristics.

Furthermore, Japanese Patent Laid-open No. Hei 9-8584 describes a setup in which circuit elements of a sending filter and a branching filter for use illustratively by a cellular phone are implemented in the form of conductive patterns on a multilayer substrate or of chip parts, with a SAW filter adopted as a receiving filter mounted on the multilayer substrate.

SUMMARY OF THE INVENTION

The present invention has been made to overcome the above and other deficiencies of the prior art and it is an object of the invention to provide a radio-frequency composite element for constituting integrally by an amplifier and a nonreciprocal circuit element, and being small and thin in size and easy to mount on a circuit board.

A radio-frequency composite element according to invention comprising: an amplifying element constituted by a body made of a multilayer substrate and of a semiconductor element attached to the multilayer substrate, and by a cover covering the body; a nonreciprocal circuit element constituted by a body assembly made of a magnetic material, of a plurality of central electrodes surrounding the magnetic material while being isolated from one another, and of a magnet applying magnetic fields to the magnetic material and the central electrodes; and by a shield shielding the body assembly; and a first connective conductor for connecting an output terminal of the amplifying element with an input terminal of the nonreciprocal circuit element.

Accordingly, the present invention is advantageous that this structure forms a small-sized amplifying element that is located adjacent to the nonreciprocal circuit element, the two components being held together in an integral fashion so that the resulting radio-frequency composite element is made thinner and smaller than ever.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the same elements are given the same reference number.

DESCRIPTION OF THE PREFERRED EMBODIMENT

First Embodiment

A first embodiment of the invention is a composite element made of an isolator and an amplifier element arranged adjacent to each other, the amplifier element having semiconductor elements mounted on a multilayer substrate. The isolator and the amplifier element are connected with a transmission line furnished on an element substrate.

Figure 1:
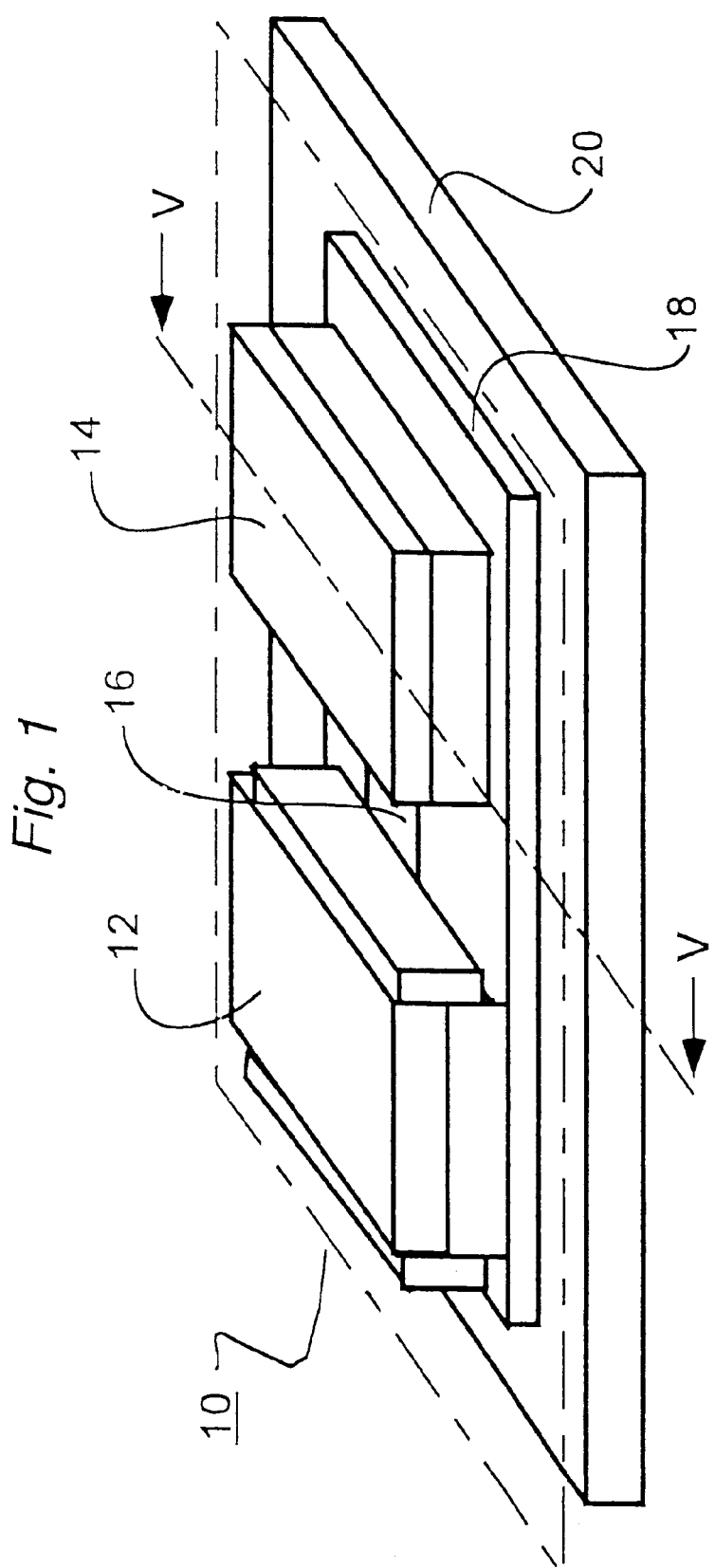
FIG. 1 is a perspective view of a composite element as an embodiment of the invention.

FIG. 1 is a perspective view of a typical composite element practiced as the first embodiment of the invention.

In FIG. 1, reference numeral 10 denotes a composite element working as a radio-frequency composite element. The composite element 10 is constituted of an isolator 12 serving as a nonreciprocal circuit element, a high-efficiency amplifier 14 as an amplifying element, and a transmission line 16 that connects an output terminal (not shown) of the high-efficiency amplifier 14 with an input terminal (not shown) of the isolator 12. All components are mounted on an element substrate 18. The transmission line 16 may be either a microstrip line or a co-planar line. The element substrate 18 is about 0.2 mm in thickness and composed of epoxy glass.

The input side of the high-frequency amplifier 14 comprises a signal input terminal, a ground terminal and a power supply terminal; the output side of the amplifier 14 includes a signal output terminal, a ground terminal and a power supply terminal. The input side of the isolator 12 has a signal input terminal and a ground terminal, and its output side is furnished with a signal output terminal and a ground terminal.

The composite element 10 is a single circuit element connected to a transmission line (not shown) on the circuit board 20 which is formed by epoxy glass or ceramics and which acts illustratively as a wireless transmitter board of a portable terminal apparatus. The element 10 is connected to other circuit elements via the transmission line, thus constituting part of the wireless transmitter of the portable terminal apparatus. The circuit board 20 is about one millimeter thick.

Figure 2:
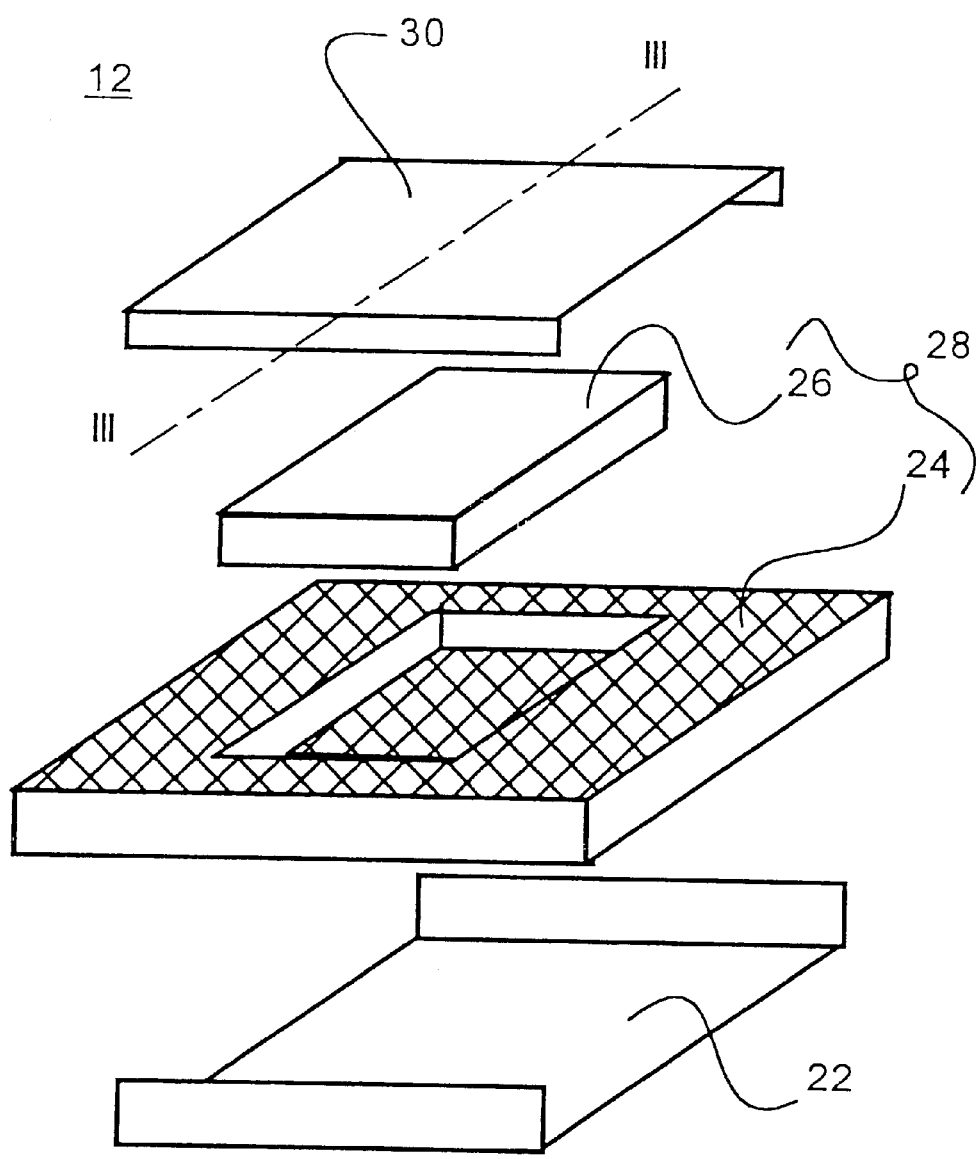
FIG. 2 is an exploded perspective view of an isolator in the composite element of FIG. 1.

FIG. 2 is an exploded perspective view of the isolator 12.

In FIG. 2, reference numeral 22 represents a lower yoke made of a magnetic material such as an iron-based substance. Reference numeral 24 denotes a resin case formed on the lower yoke 22 in which an isolator body assembly 26 is embedded. The isolator body assembly 26 is of a known type such as one disclosed in Japanese Patent Laid-open No. Hei 10-327003. The assembly 26 is constituted of a centrally positioned magnetic material such as ferrite, three central electrodes that surround the ferrite while being isolated from one another, and a magnet applying magnetic fields to the magnetic material and to the central electrodes.

Of the three central electrodes, one is connected to the input terminal of the isolator, another to its output terminal, and the other to a terminating resistor.

An upper yoke 30 is positioned facing the lower yoke 22 in such a manner that an isolator body 28 made of the isolator body assembly 26 and resin case 24 is interposed between the two yokes. The upper yoke 30 is formed of the same magnetic material as that of the lower yoke 22.

Figure 3:
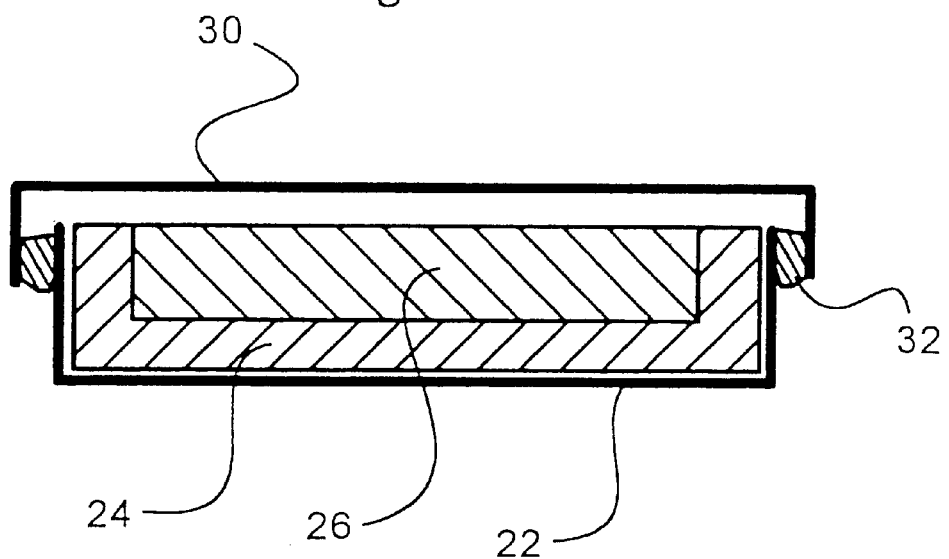
FIG. 3 is a cross-sectional view taken on line III—III of the isolator in FIG. 2.

FIG. 3 is a cross-sectional view taken on line III—III of the isolator 12 in FIG. 2.

The upper yoke 30 and lower yoke 22, serving as a shield, are soldered together to form a magnetic circuit.

Figure 4:
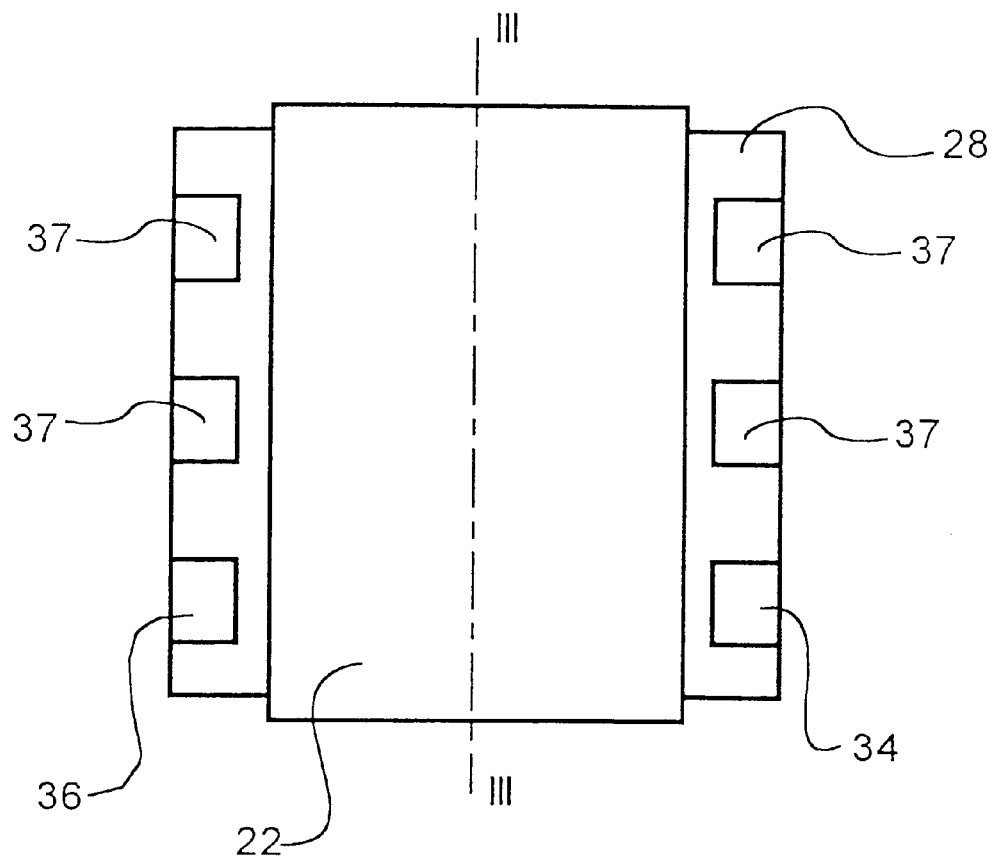
FIG. 4 is a bottom view of the inventive isolator.

FIG. 4 is a bottom view of the isolator 12. The vertical direction seen in FIG. 4 corresponds to the direction of the cross-section III—III. In FIG. 4, reference numeral 34 stands for the input terminal of the isolator 12; 36 for its output terminal; and 37 for ground terminals. These terminals are furnished on projections from both sides of the lower yoke 22.

Figure 5:
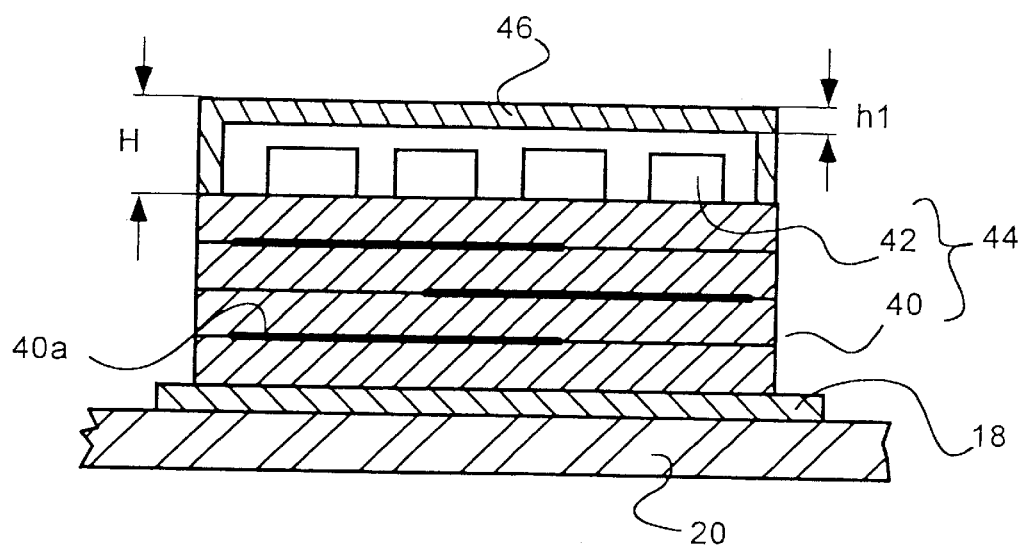
FIG. 5 is a cross-sectional view taken on line V—V of FIG. 1 a high-efficiency amplifier in the composite element.

FIG. 5 is a cross-sectional view taken on line V—V of the high-efficiency amplifier 14 included in FIG. 1.

In FIG. 5, reference numeral 40 denotes a multilayer substrate that is about 0.8 mm thick and made of epoxy glass or glass ceramics. Reference numeral 40a represents a wiring layer of the multilayer substrate 40, and numeral 42 stands for circuit elements provided on the multilayer substrate 40. Each semiconductor element, one of the circuit elements 42, is formed separately before being mounted on the multilayer substrate 40. The multilayer substrate 40 and circuit elements 42 make up a high-efficiency amplifier body 44 that is a main body of the amplifying element. Reference numeral 46 denotes a cover that protects the high-efficiency amplifier body 44, measuring about 0.7 mm in height (H) and 0.1 mm to 0.15 mm in thickness (h1).

The transmission line 16, which usually has a characteristic impedance of 50 ohms, is set for a characteristic impedance of less than 50 ohms, illustratively 3 to 30 ohms and preferably 10 to 20 ohms in this embodiment.

Getting the transmission line 16 to offer the characteristic impedance of less than 50 ohms makes it easier to match the output impedance of the high-efficiency amplifier 14 with the input impedance of the isolator 12. This provides for reduced margins of specifications regarding the high-efficiency amplifier 14, isolator 12, and transmission line 16 formed on the element substrate 18, whereby the manufacturing cost of the composite element 10 is lowered.

How the composite element 10 works will now be described.

The signal amplified by the high-efficiency amplifier 14 is propagated over the transmission line 16 before being output from the output terminal 36 via the isolator 12. Radio waves reflected downstream of the isolator 12 return to the isolator 12 through the output terminal 36 of the isolator 12. But the waves never reach the isolator input terminal 34, flowing instead to the terminating resistor through the central elements of the isolator body assembly 26 and consumed by the terminating resistor. That is, the reflected waves are cut off by the isolator 12 without been fed back to the high-efficiency amplifier 14. This allows the amplifier 14 to operate in a significantly efficient and stable manner.

In the first embodiment, the high-efficiency amplifier body 44 has its surface area appreciably reduced using the multilayer substrate 40 which, although expensive, can form the wiring layer 40a three-dimensionally and comprise semiconductor elements integrally.

The isolator 12 is about two millimeters in elevation, one of the tallest parts of the portable terminal apparatus. It is difficult to make the isolator 12 lower in height because its height directly affects its characteristics. The high-efficiency amplifier 14 is thus allowed to be taller provided it will not exceed the height of the isolator 12. The benefit of the high-efficiency amplifier 14 having its surface area reduced outweighs the disadvantage of a somewhat thicker amplifier body 44 resulting from using the multilayer substrate 40.

The composite element 10 of the first embodiment has the isolator 12 and high-efficiency amplifier body 44 mounted adjacent to each other on the element substrate 18 and connected by the transmission line 16. In this setup where the composite element 10 is not taller than the combined height of the element substrate 18 and isolator 12, the element 10 is rendered thinner than before while the isolator 12 is protected against deterioration in characteristics. Because the high-efficiency amplifier 14 has its surface area reduced using the multilayer substrate 40, the composite element 10 occupies less space than before correspondingly.

As a result, the first embodiment offers a thin and compact structure not available with conventional setups in which the isolator is integrally mounted on the circuit board of the amplifier.

On the element substrate 18, the small-sized high-efficiency amplifier 14 is integrally connected with the isolator 12 using the low-impedance transmission line 16 to constitute the composite element 10. In this makeup, it is easy to achieve necessary impedance matching among the components making up the composite element with less margins of specifications than before. This makes it possible to constitute an inexpensive composite element with a reduced transmission loss.

The transmission line 16 is checked for characteristics between the high-efficiency amplifier 14 and the isolator 12 before assembling of the composite element 10. The line characteristics thus obtained are used as a basis for adjusting the high-efficiency amplifier 14 and isolator 12 in their characteristics. This minimizes characteristic variations of the composite element 10 and thus helps enhance the yield rate of the element 10.

There is no need for wireless transmitter designers to design specifics of the transmission line 16 between the high-efficiency amplifier 14 and the isolator 12. This helps reduce the development period of the wireless transmitter.

Second Embodiment

A second embodiment of the invention involves making the composite element thinner by use of a thinned element substrate. A reduced flexural rigidity of the composite element resulting from making the element substrate thinner is compensated by integrally forming both the upper yoke of the isolator and the cover of the high-efficiency amplifier.

Figure 6:
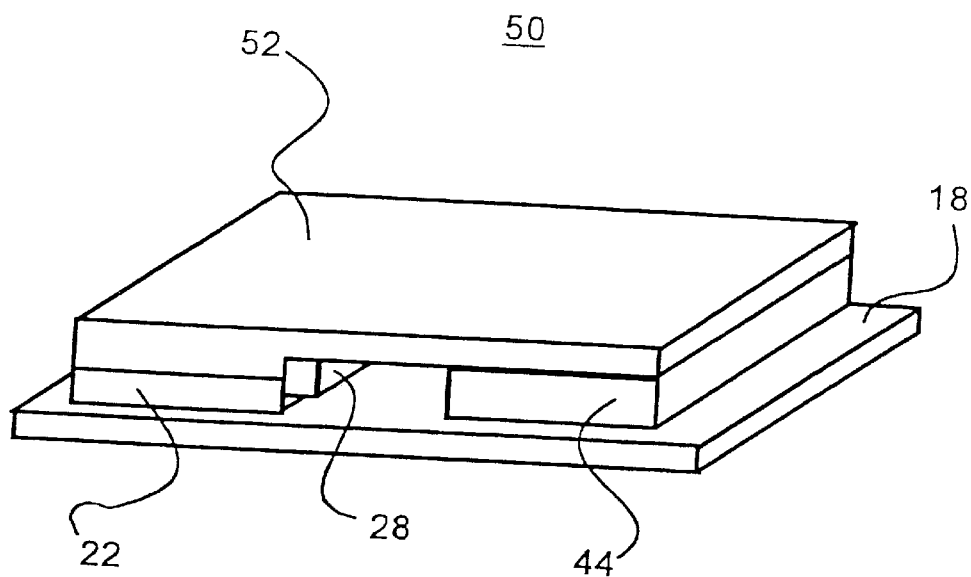
FIG. 6 is a perspective view of a composite element as another embodiment of the invention.

FIG. 6 is a perspective view of a typical composite element practiced as the second embodiment of the invention.

In FIG. 6, reference numeral 50 denotes the composite element, and numeral 52 stands for a common cover, serving as a shield, that shields components. The common cover 52 is basically made of the same material as that of the upper yoke 30 in the first embodiment. The composite element 50 constituting the second embodiment has the same structure as the first embodiment except for the presence of the common cover 52 and a thinner element substrate 18.

In FIG. 6, the reference numerals already used in the first embodiment designate like or corresponding parts. In the embodiments to be described below, like reference numerals also designate like or corresponding components.

In the second embodiment, the composite element 50 is made thinner by reducing the thickness of the element substrate 18. A diminishing thickness of the element substrate 18 entails a reduction in its flexural rigidity, which can result in a bent on the transmission line 16 connecting the isolator body 28 with the high-efficiency amplifier body 44. Such line deformation is prevented by integrally forming the iron-based upper yoke 30 and cover 46 to make up for the reduced substrate rigidity, whereby the flexural rigidity of the transmission line 15 is maintained in the composite element 50.

The composite element 50 of the second embodiment is made thinner but retains its flexural rigidity, thus ensuring mechanical reliability. A simplified structure of the second embodiment makes the composite element 50 less costly than before.

Third Embodiment

A third embodiment of the invention involves forming concave portions on a element substrate so that an isolator including its bottom, and part of a high-efficiency amplifier are placed into the concave portions to constitute a thinner composite element.

Figure 7:
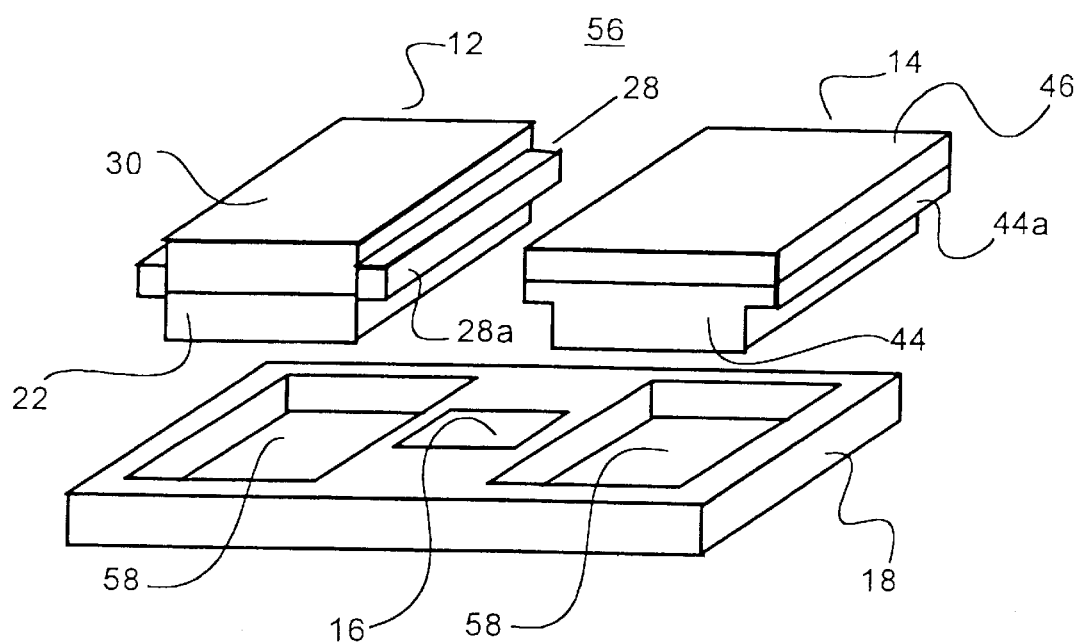
FIG. 7 is an exploded perspective view of a composite element as a further embodiment of the invention.

FIG. 7 is an exploded perspective view of a typical composite element practiced as the third embodiment of the invention.

In FIG. 7, reference numeral 56 stands for a composite element, and numeral 58 denotes concave portions formed on an element substrate 18. The concave portions 58 accommodate a lower yoke 22 of an isolator 12, part of the bottom of an isolator body 28, and part of the bottom of a high-efficiency amplifier body 44.

The isolator body 28 and high-efficiency amplifier body 44 are on both sides of each provided with projections 28a and 44a which prevent the bodies from being completely embedded into the concave portions 58. On a lower part of the projections 28a from the isolator body 28 are an input terminal 34 (not shown) and an output terminal 36 (not shown). On a lower part of the projections 44a from the high-efficiency amplifier body 44 are input and output terminals (not shown). The input terminal 34 of the isolator body 28 is connected with the output terminal of the high-efficiency amplifier body 44 by means of a transmission line 16.

The composite element 56 of the third embodiment comprises the concave portions 58 on the element substrate 18 to let the isolator 12 and high-efficiency amplifier 14 be partially embedded therein. Because a thickened element substrate 18 does not make the composite element 56 thicker, the substrate 18 is allowed to be thick enough to provide a sufficient flexural rigidity and an adequate mechanical strength.

The composite element 56 constituting the third embodiment has the same structure as the first embodiment except that the element substrate 18 has the concave portions 58 and that the isolator body 28 and high-efficiency amplifier body 44 are modified in shape.

The composite element 56 of the third embodiment is reduced as much in thickness as the extent to which the isolator 12 and high-efficiency amplifier 14 are embedded. That is, the composite element 56 may be rendered as thin as the isolator 12 and the high-efficiency amplifier 14 respective.

The third embodiment is characterized that both the isolator 12 and the high-efficiency amplifier 14 are embedded in the concave portions 58. Alternatively, either the isolator 12 or the high-efficiency amplifier 14 alone may be placed into the concave portion 58.

In the third embodiment, the isolator body 28 and high-efficiency amplifier body 44 are on both sides of each provided with the projections 28a and 44a whose lower sides are connected to the transmission Line 16 and other parts. Alternatively, the input and output terminals on the projections 28a and 44a may be replaced by I/O terminals such as leads attached to the sides of the isolator body 28 and high-efficiency amplifier body 44, and lower sides of the I/O terminals may be connected to the transmission line 16 and others on the element substrate. The concave portions 58 may be either through-holes or blind holes.

Fourth Embodiment

A fourth embodiment of the invention involves replacing the isolator with a circulator having an input terminal, an output terminal, and a third terminal. The third terminal is connected to a terminating resistor via a transmission line. The terminating resistor is positioned outside the circulator to promote heat dissipation of the resistor.

Figure 8:
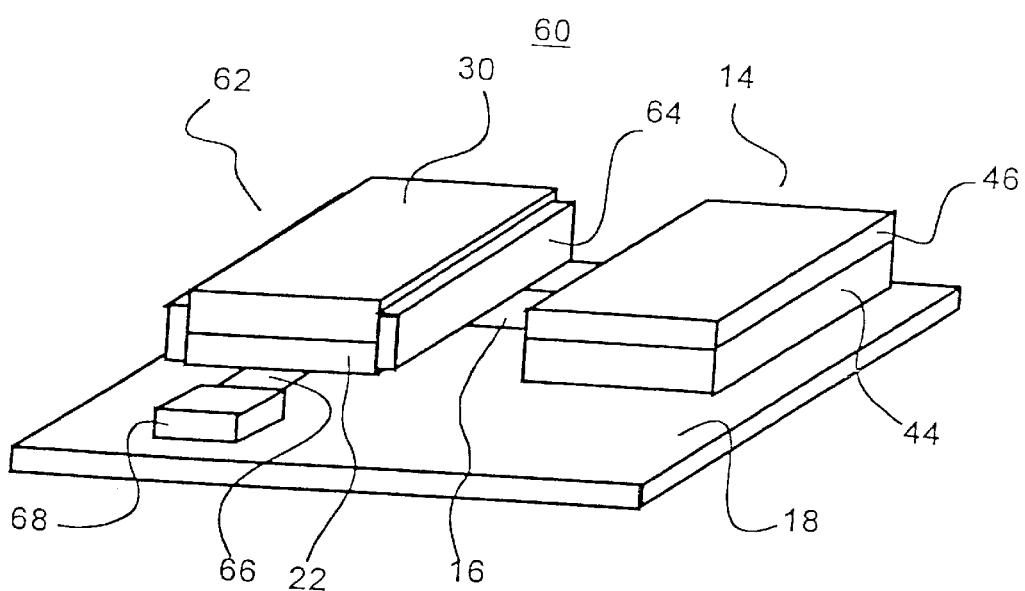
FIG. 8 is a perspective view of a composite element as an even further embodiment of the invention.
Figure 9:
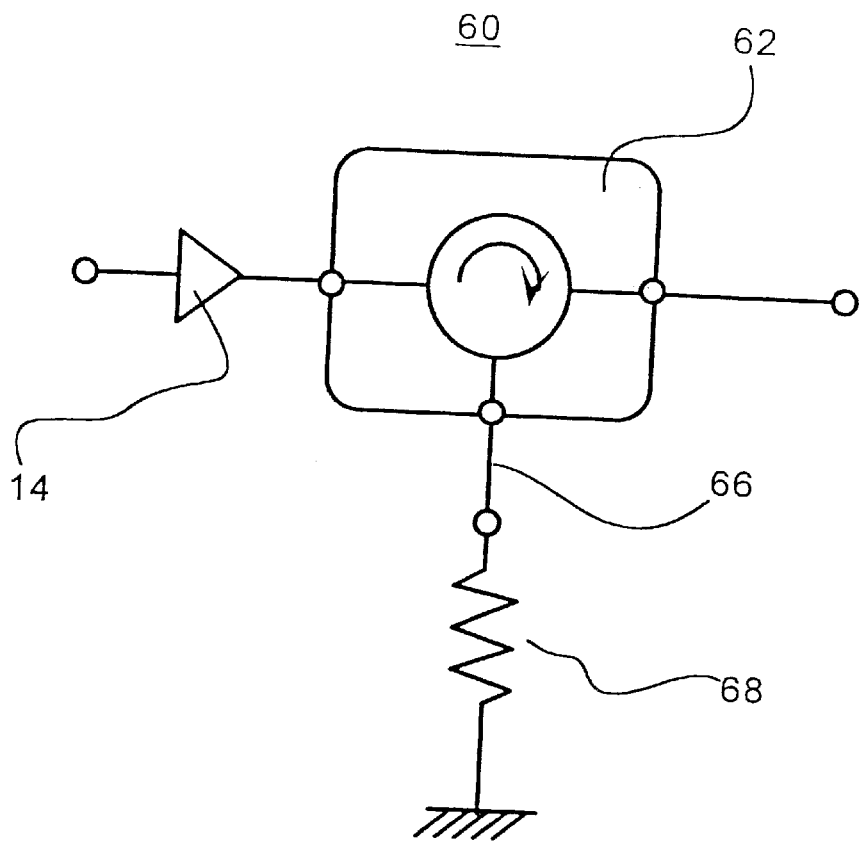
FIG. 9 is a circuit diagram of an equivalent circuit applicable to the composite element in FIG. 8.

FIG. 8 is a perspective view of a typical composite element practiced as the fourth embodiment of the invention. FIG. 9 is a circuit diagram of an equivalent circuit applicable to the composite element in FIG. 8.

In FIG. 8, reference numeral 60 stands for a composite element; 62 for a circulator acting as a nonreciprocal circuit element; 64 for a circulator body; 66 for a transmission line serving as a second connective conductor; and 68 for a terminating resistor.

Although not shown specifically, the circulator body 64 is constituted illustratively of a centrally positioned magnetic material such as ferrite, three central electrodes that surround the ferrite while being isolated from one another, a magnet applying magnetic fields to the magnetic material and to the central electrodes, and a resin case enclosing these components. That is, the circulator body 64 is basically the same in structure as the isolator body 28 of the first embodiment except that the circulator body 64 does not include a terminating resistor.

Of the three central electrodes, one is connected to the input terminal of the circulator 62, another to its output terminal, and another to the transmission line 66 that in turn is connected to the terminating resistor 68.

The circulator 62 is made up of an upper yoke 30, the circulator body 64, and a lower yoke 22. The input and output terminals of the circulator 62 are formed on projections of the circulator body 64 protruding from the lower yoke 22. The input and output terminals are connected to the transmission line 16 on the element substrate 18. The circulator 62 and terminating resistor 68 combine to provide the same function as that of an isolator.

In the first embodiment, any reflected power coming through the output terminal 36 is transformed into heat by the built-in terminating resistor in the isolator 12. That means the isolator 12 is subject to a suitable thermal design constraining efforts to make the element smaller and less expensive. In the third embodiment, by contrast, any reflected power entering the circulator 62 through its output terminal is transformed into heat by the terminating resistor 68. The structure eliminates the need for a thermal design of the circulator 62, permitting fabrication of a smaller-sized element.

Figure 10:
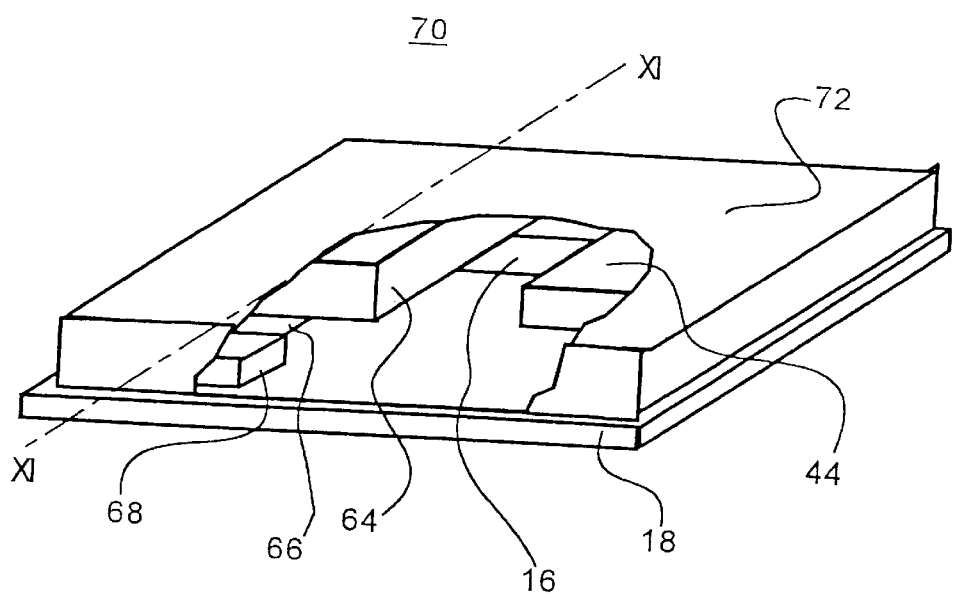
FIG. 10 is a partially broken perspective view of a variation of the composite element in FIG. 8.

FIG. 10 is a partially broken perspective view of a variation of the composite element in FIG. 8. In FIG. 10, reference numeral 70 represents a composite element. Reference numeral 72 denotes a shield cover that shields components. In constituting a magnetic circuit of the circulator 62, the shield cover 72 is formed by a magnetic material such as an iron-based substance. In this setup, the shield cover 72 is extended to the lower side of the circulator body 64.

Figure 11:
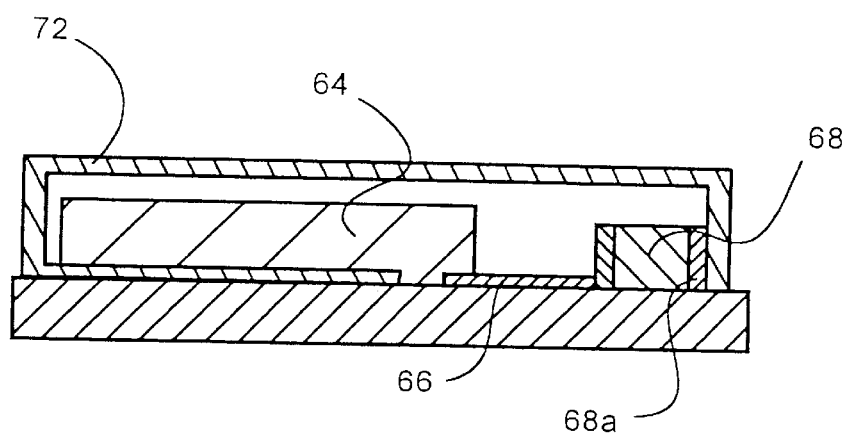
FIG. 11 is a cross-sectional view taken on line XI—XI of the composite element in FIG. 10.

FIG. 11 is a cross-sectional view taken on line XI—XI of the composite element 70 in FIG. 10. As shown in FIG. 11, a cooling edge 68a of the terminating resistor 68 is brought into contact with the shield cover 72. This arrangement promotes heat dissipation of the terminating resistor 68.

Figure 12:
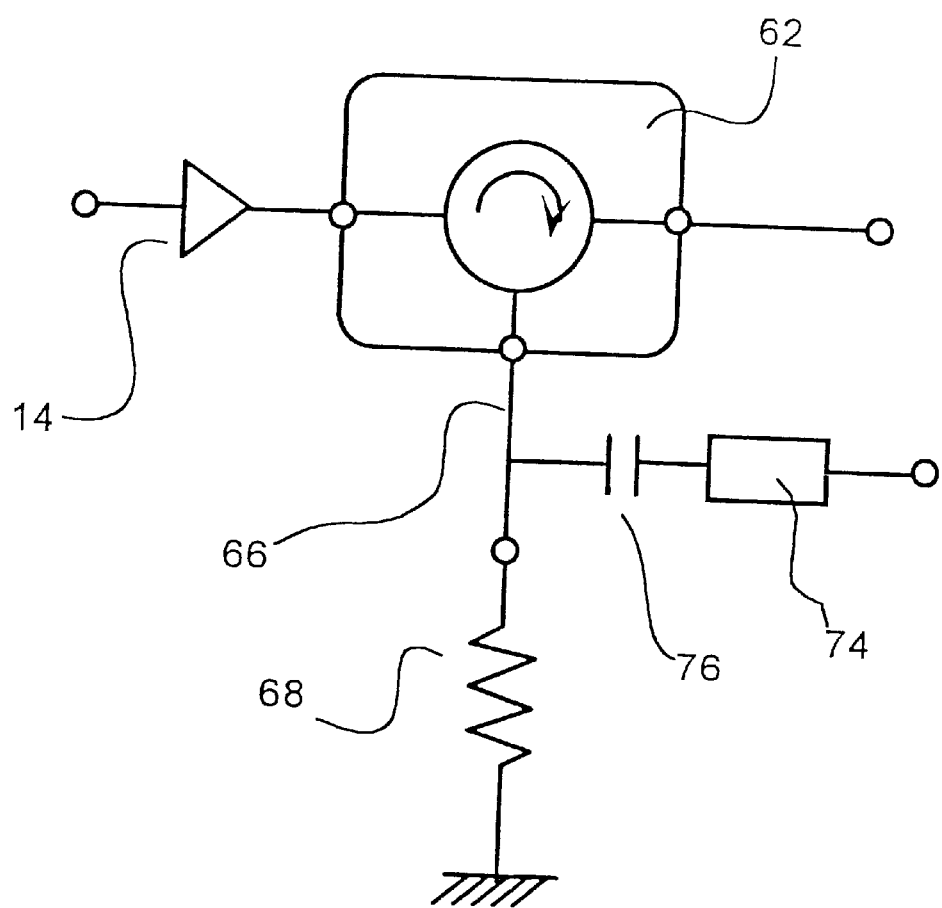
FIG. 12 is a circuit diagram of an equivalent circuit applicable to another variation of the composite element.

FIG. 12 is a circuit diagram of an equivalent circuit applicable to another variation of the composite element.

In FIG. 12, reference numeral 74 represents a detection circuit. Connecting the detection circuit 74 interposingly between the circulator 62 and the terminating resistor 68 allows reflected power to be measured. More specifically, a capacitor 76 that acts as a connector optimizing the amount of power being detected is connected interposingly between the terminating resistor 68 and the detection circuit 74, whereby the reflected power is detected.

Fifth Embodiment

A fifth embodiment of the invention involves having an isolator and a high-efficiency amplifier enveloped by an integrally formed shield cover. The isolator and the shield cover are soldered together to improve the bond strength of the isolator as it is formed integrally in a composite element.

Figure 13:
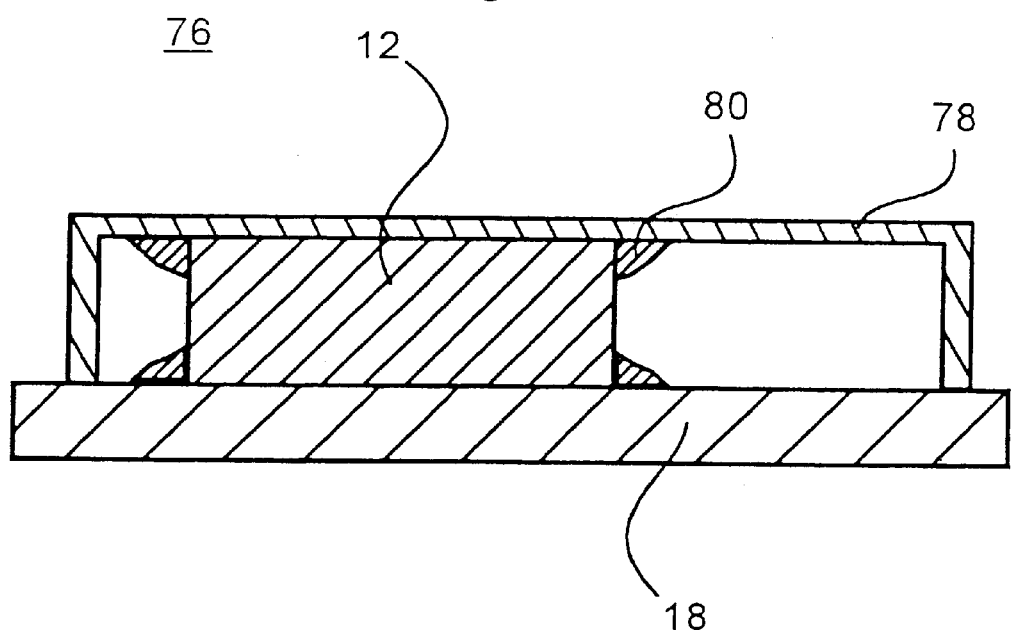
FIG. 13 is a cross-sectional view of a composite element as a still further embodiment of the invention.

FIG. 13 is a cross-sectional view of a typical composite element practiced as the fifth embodiment of the invention. In FIG. 13, reference numeral 76 stands for a composite element; 78 for a shield cover made of metal; and 80 for solder.

In FIG. 13, the shield cover 78 envelops a high-efficiency amplifier 14 (not shown) and an isolator 12. In this composite element 76, a top ground surface of the isolator 12 is soldered to the shield cover 78 to ensure better grounding of the isolator 12. This arrangement also improves mechanical bond strength between the isolator 12 and the shield cover 78.

Figure 14:
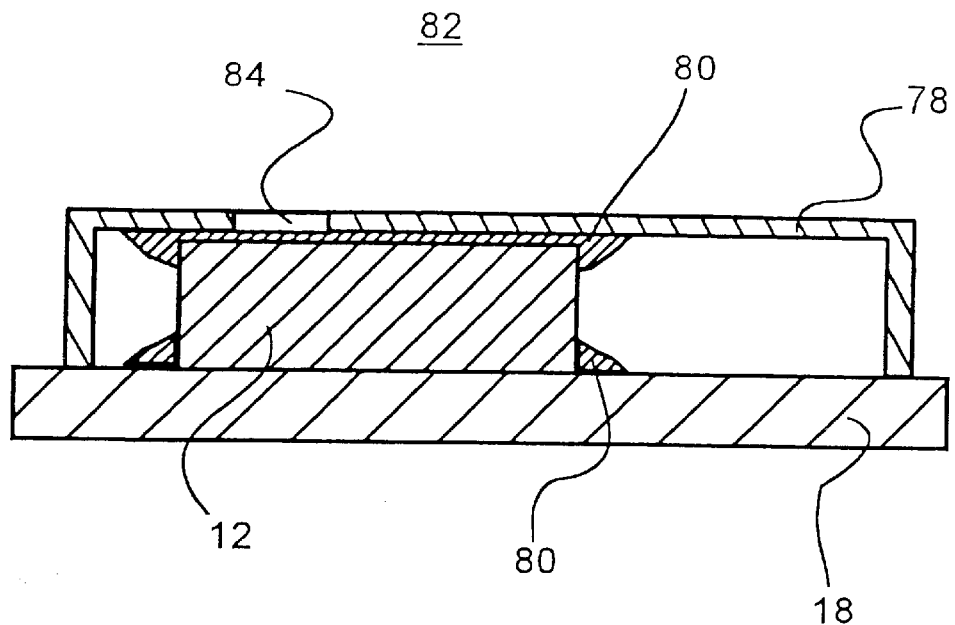
FIG. 14 is a cross-sectional view of a variation of the composite element in FIG. 13.

FIG. 14 is a cross-sectional view of a variation of the composite element in FIG. 13. In FIG. 14, reference numeral 82 denotes a composite element, and numeral 84 represents an opening 84 on the shield cover 78.

The composite element 82 has the opening 84 furnished on that part of the shield cover 78 which is bonded to the top of the isolator 12. It is through the opening 84 that the shield cover 78 is soldered to the upper part of the isolator 12. The opening 84 makes soldering work easier to perform and permits simpler verification of the soldered state.

Figure 15:
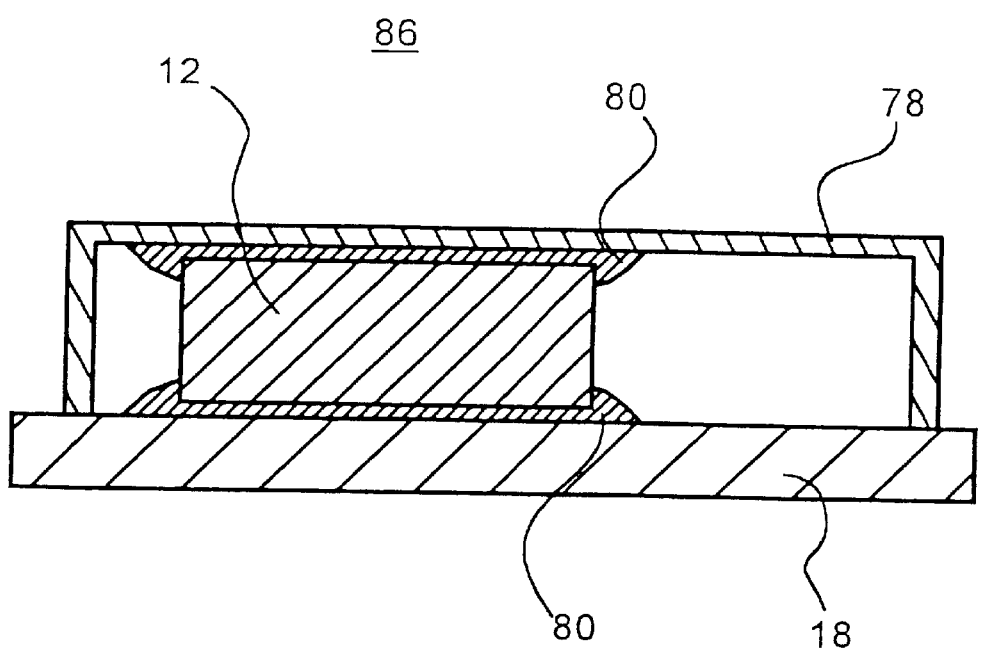
FIG. 15 is a cross-sectional view of another variation of the composite element.

FIG. 15 is a cross-sectional view of another variation of the composite element. In FIG. 15, reference numeral 86 denotes a composite element.

In this composite element 86, both the lower and the lateral parts of the isolator 12 are soldered to the element substrate 18 to provide better grounding of the isolator 12. The arrangement also improves the mechanical bond strength between the isolator 12 and the element substrate 18.

Sixth Embodiment

A sixth embodiment of the invention involves having a triplet strip line make up a transmission line connecting an isolator with a high-efficiency amplifier.

Figure 16:
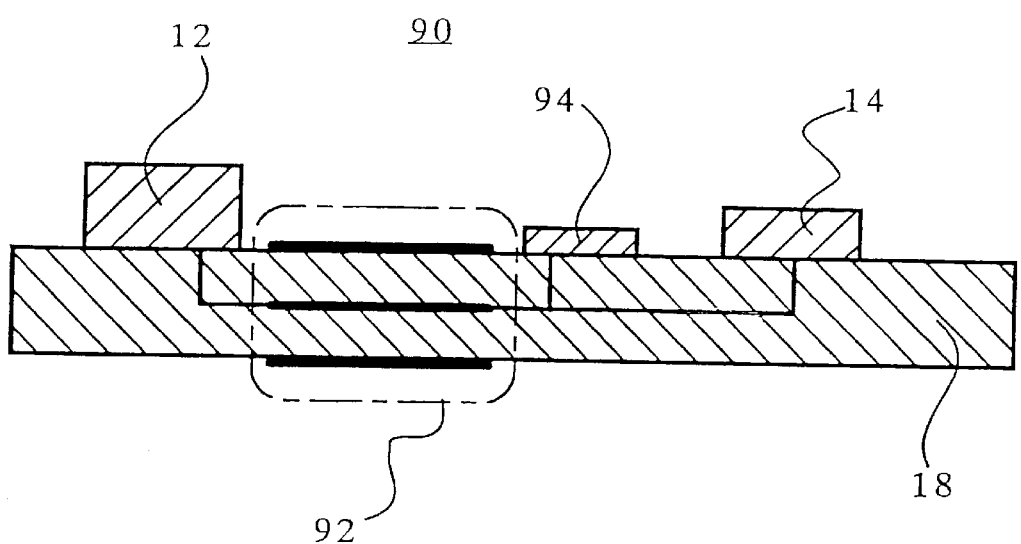
FIG. 16 is a cross-sectional view of a composite element as a yet further embodiment of the invention.

FIG. 16 is a cross-sectional view of a typical composite element practiced as the sixth embodiment of the invention. In FIG. 16, reference numeral 90 stands for a composite element; 92 for a triplet strip line used as a transmission line 16 furnished on an element substrate 18; and 94 for a matching circuit. The width of the triplet strip line 92 forming the transmission line 16 is less than that of a microstrip line constituting the same line 16 if the characteristic impedance of the transmission line 16 is held the same. The triplet strip line 92, when thus employed, contributes to making the composite element 90 smaller in size.

Connecting the matching circuit 94 to the triplet strip line 92 makes it easier to correct variations in the output impedance of the high-efficiency amplifier 14, in the input impedance of the isolator 12, and in the characteristic impedance of the triplet strip line 92.

Seventh Embodiment

A seventh embodiment of the invention involves connecting an input terminal of an isolator directly with an output terminal of a high-efficiency amplifier while eliminating an element substrate carrying a transmission line. The structure helps reduce the thickness of a composite element made of the isolator and high-efficiency amplifier.

Figure 17:
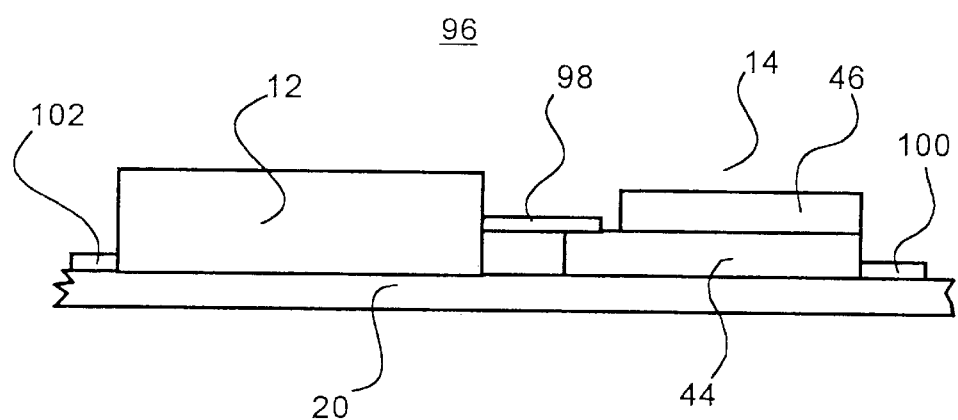
FIG. 17 is a side view of a composite element as another embodiment of the invention.

FIG. 17 is a side view of a typical composite element practiced as the seventh embodiment of the invention.

In FIG. 17, reference numeral 96 denotes a composite element, and numeral 98 represents an input terminal of the isolator 12. The input terminal 92 projects like a lead from the isolator 12 so that the terminal 92 may be readily connected to an output terminal (not shown) of the high-efficiency amplifier 14 on an upper part of the high-efficiency amplifier body 44.

Reference numeral 100 stands for an input terminal used by the composite element 96, the input terminal being furnished on the high-efficiency amplifier 14. Reference numeral 102 denotes an output terminal for use by the composite element 96, the output terminal being provided on the isolator 12. A signal terminal, a power supply terminal, and a ground terminal are also furnished to each terminal of the high-efficiency amplifier 14 and isolator 12. In the seventh embodiment, the input terminal 100 and output terminal 102 are furnished in the form of leads that are flush with the bottoms of the high-efficiency amplifier 14 and isolator 12 respectively.

In the composite element 96, the input terminal 98 of the isolator 12 is directly connected to the output terminal of the high-efficiency amplifier 14. The input terminal 98 doubles as a transmission line and serves to connect the isolator 12 integrally with the high-efficiency amplifier 14. This structure makes the element substrate unnecessary.

The composite element 96 is thus reduced as much in thickness as the extent to which the eliminated element substrate formerly occupied space. The composite element 96, made as low in height as the isolator 12 and the high-efficiency amplifier 14 respective, turns out to be thinner and more lightweight than ever before.

With the input terminal 98 directly connected to the output terminal of the high-efficiency amplifier 14, the isolator 12 and amplifier 14 become contiguous to each other. This reduces the length of the connecting line and lowers transmission loss correspondingly.

Furthermore, because the input terminal 100 and output terminal 102 are made flush with the bottoms of the high-efficiency amplifier 14 and isolator 12 respectively, the composite element 96 may be mounted mechanically onto the surface of a circuit board 20. The mechanized procedure simplifies the assembling process so that it can be performed in an appreciably shorter period than before.

Figure 18:
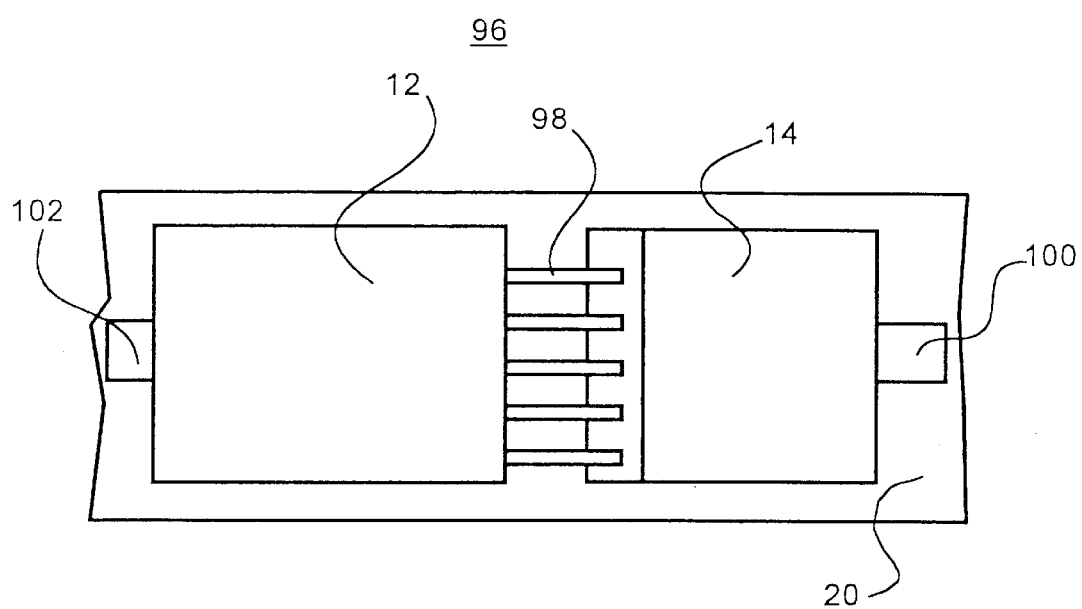
FIG. 18 is a plan view of a variation of the composite element in FIG. 17.

FIG. 18 is a plan view of a variation of the composite element in FIG. 17. In FIG. 18, the isolator 12 has not one signal input terminal but a plurality of terminals including a ground terminal. The multiple terminals ensure direct connections to electrodes of the high-efficiency amplifier 14 including an output signal electrode and a ground electrode. This structure reduces mechanical loads on the input terminal arrangement of the isolator 12 and enhances the mechanical strength of the parts. As a result, the composite element 98 is increased in mechanical reliability when it is handled.

In addition, not only electrical terminals but also mechanical fittings for connections and a shield cover may be formed integrally. Such a structure, if implemented, will reduce mechanical loads on individual input terminals and improve the mechanical reliability of the parts.

Eighth Embodiment

An eighth embodiment of the invention involves attaching connective members to edges of an isolator and a high-efficiency amplifier so that the isolator and amplifier will be formed integrally. With this structure, the embodiment makes up a thinner composite element than before.

Figure 19:
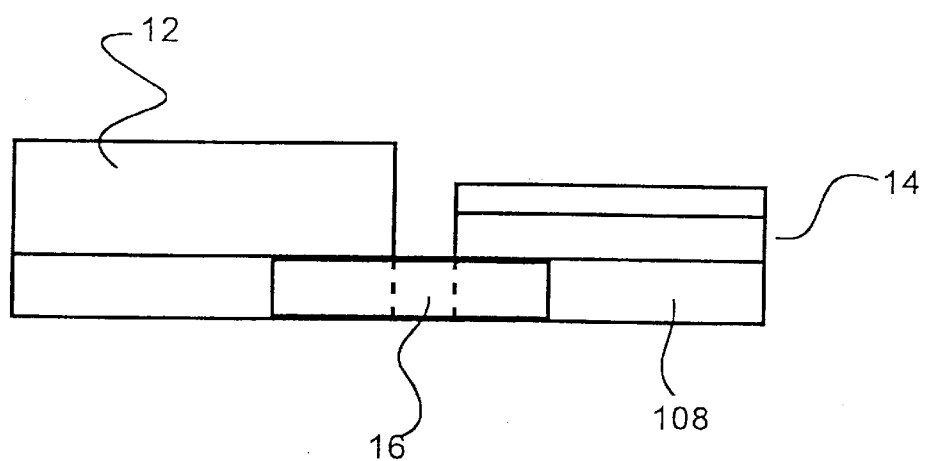
FIG. 19 is a side view of a composite element as a further embodiment of the invention.
Figure 20:
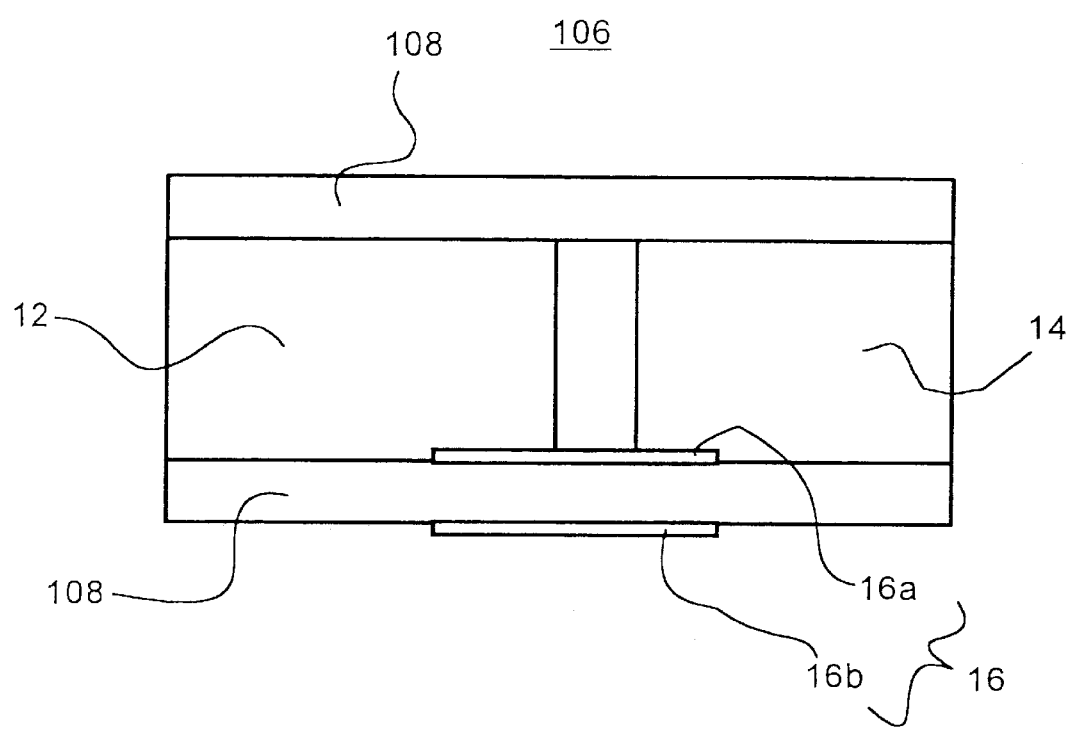
FIG. 20 is a plan view of the composite element in FIG. 19.

FIG. 19 is a side view of a composite element practiced as the eighth embodiment of the invention. FIG. 20 is a plan view of the composite element in FIG. 19.

In FIGS. 19 and 20, reference numeral 106 denotes a composite element, and numeral 108 represents fastening boards which hold an isolator 12 and a high-efficiency amplifier 14 integrally and which act as a dielectric substrate each. Reference numeral 16a stands for a signal line included in a transmission line 16, and numeral 16b denotes a ground line in the transmission line 16.

The composite element 106 is formed by having the isolator 12 and high-efficiency amplifier 14 bonded integrally by means of the fastening boards 108 attached to edges of the two components. The fastening boards 108 may contain a transmission line, power supply electrodes and ground electrodes.

With the fastening boards mounted laterally, the eighth embodiment is reduced as much in thickness as the extent to which the eliminated element substrate formerly occupied space. The composite element 106, made as low in height as the isolator 12 and the high-efficiency amplifier 14 respective, proves to be thinner and lighter than ever.

Ninth Embodiment

A ninth embodiment of the invention involves getting resin layers to surround an isolator and a high-efficiency amplifier mounted on an element substrate. The structure is designed to enhance the flexural rigidity of a composite element formed by the isolator and amplifier.

Figure 21:
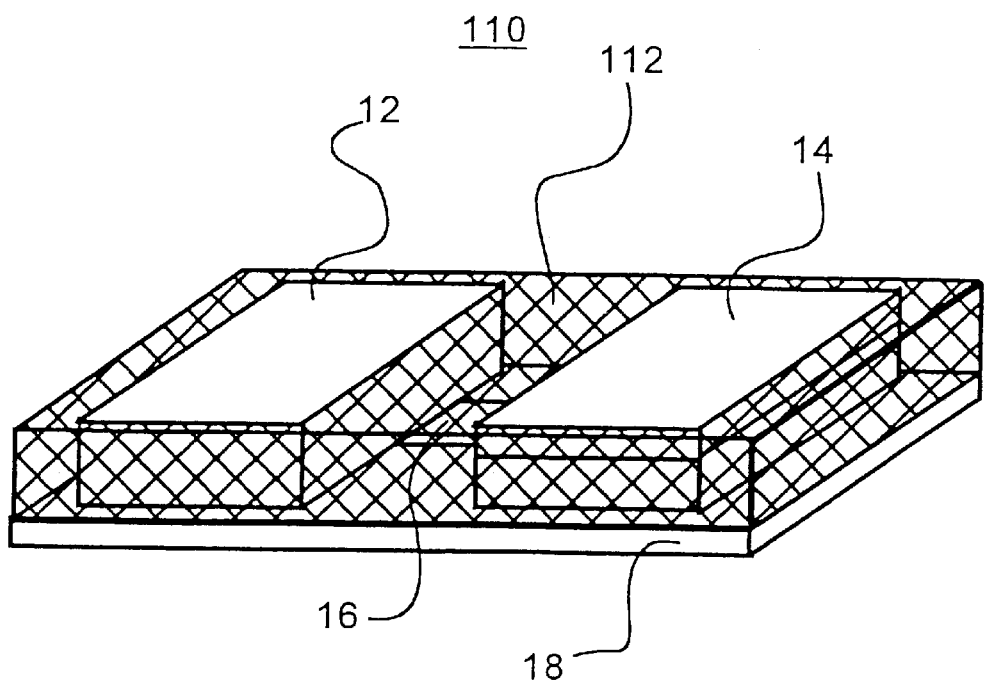
FIG. 21 is a partially transparent perspective view of a composite element as an even further embodiment of the invention.

FIG. 21 is a partially transparent perspective view of a composite element practiced as the ninth embodiment of the invention. In FIG. 21, reference numeral 110 stands for a composite element, and 112 for resin layers.

The composite element 110 has the isolator 12 and high-efficiency amplifier 14 soldered to an element substrate 18 and interconnected by a transmission line 16 furnished on the substrate 18. The resin layers 112 are bonded to the substrate in a way surrounding the isolator 12 and high-efficiency amplifier 14. The structure minimizes the thickness of the element substrate 18. Although flexural rigidity of the composite element reduced resulting from making the element substrate 18 thinner, it is compensated by the resin layers 112 enveloping the isolator 12 and high-efficiency amplifier 14.

In the ninth embodiment, the tops of the isolator 12 and high-efficiency amplifier 14 are not covered with the resin layers 112 so as not to increase the thickness of the composite element 110. Alternatively, either the isolator 12 or the high-efficiency amplifier 14, whichever is the lower in height, may be covered with the resin layers 112.

The composite element 110 of the ninth embodiment is reduced in thickness and furnished with provisions to compensate for the resulting drop in its mechanical rigidity. This provides a thin-shaped, mechanically strong and reliable composite element.

Tenth Embodiment

A tenth embodiment of the invention involves getting thinned element substrates to bond together the tops and bottoms of an isolator and a high-efficiency amplifier so as to constitute a composite element with improved flexural rigidity.

Figure 22:
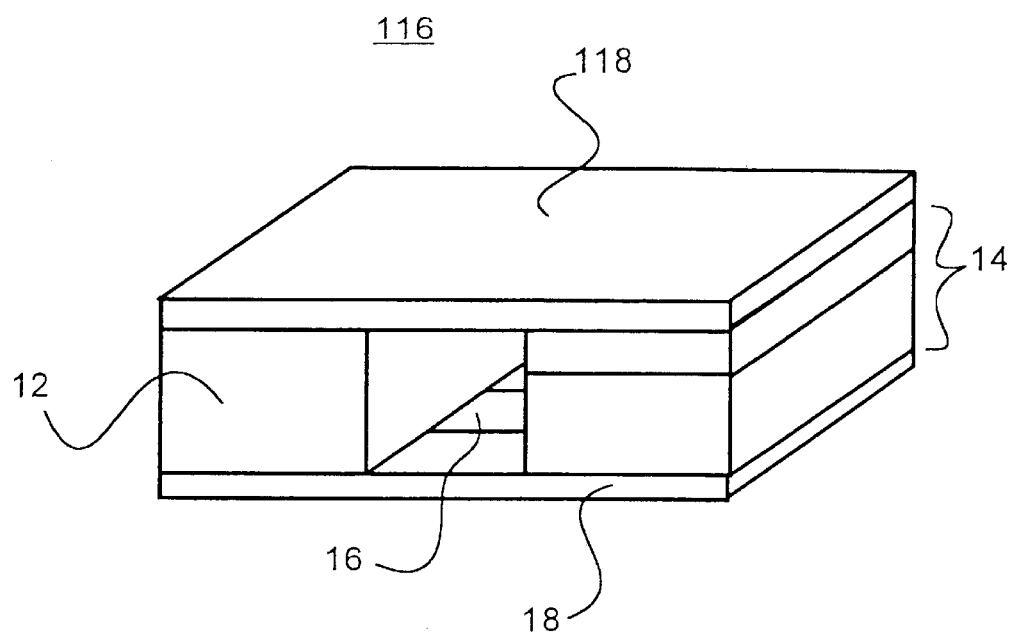
FIG. 22 is a perspective view of a composite element as a still further embodiment of the invention.

FIG. 22 is a perspective view of a composite element practiced as the tenth embodiment of the invention. In FIG. 22, reference numeral 116 represents a composite element, and numeral 118 denotes an upper element substrate.

The composite element 116 of the tenth embodiment is formed by an isolator 12 and a high-efficiency amplifier 14 soldered to an element substrate 18. Interconnected by a transmission line 16 furnished on the element substrate 18, the isolator 12 and high-efficiency amplifier 14 have their tops further soldered to the upper element substrate 118.

The element substrate 18 diminishes in flexural rigidity when made thinner but still offers a relatively high level of tensile strength. A thinned substrate 18 is more likely to bend but still resists breaking. The substrate arrangement ensures mechanical reliability when compensated for the decrease in flexural rigidity.

In the tenth embodiment, the tops and bottoms of the isolator 12 and high-efficiency amplifier 14 are bonded together by the upper element substrate 118 and element substrate 18 respectively to form a composite element in an integral manner. Even as it is made thinner, the composite element resists any decrease in its flexural rigidity and thus provides high mechanical reliability.

Eleventh Embodiment

An eleventh embodiment of the invention involves laterally extending a lower yoke, a resin case and an upper yoke of an isolator; bonding to the resin case an isolator body assembly and a high-efficiency amplifier body arranged adjacent to each other; and interconnecting the isolator body assembly with the high-efficiency amplifier body using a transmission line furnished on the resin case between the isolator body assembly and the high-efficiency amplifier body. These components are assembled integrally to constitute a composite element.

Figure 23:
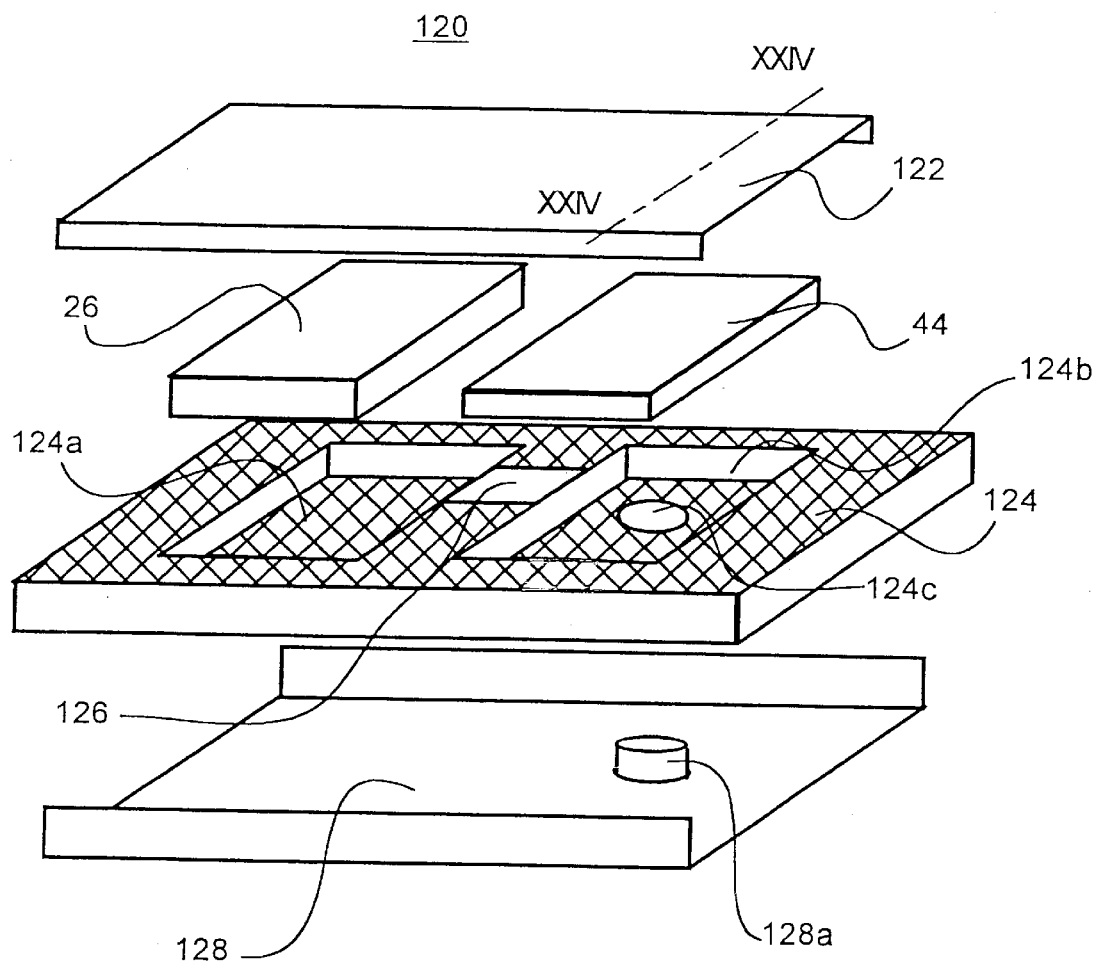
FIG. 23 is an exploded perspective view of a composite element as a yet further embodiment of the invention.

FIG. 23 is an exploded perspective view of a composite element practiced as the eleventh embodiment of the invention. In FIG. 23, reference numeral 120 stands for a composite element; 122 for an upper yoke; 124 for a resin case as a resin structure; 124a for an isolator pocket; and 124b for an amplifier pocket. The isolator pocket 124a and amplifier pocket 124b are formed a short distance apart and adjacent to each other in the resin case 124.

An isolator body assembly 26 and a high-efficiency amplifier body 44 are inserted into the isolator pocket 124a and amplifier pocket 124b respectively. A transmission line 126, interposed between the isolator pocket 124a and the amplifier pocket 124b, connects an output terminal (not shown) of the high-efficiency amplifier body 44 with an input terminal (not shown) of the isolator body assembly 26. The structure eliminates the need for an element substrate and reduces the composite element as much in thickness as the extent to which the removed element substrate formerly occupied space.

The amplifier pocket 124b has an opening 124c, and the lower yoke 128 has a projection 128a in the position corresponding to the opening 124c of the amplifier pocket 124b. The projection 128a is passed through the opening 124c and brought into contact with the bottom of the high-efficiency amplifier body 44. In this setup, the projection 128a is soldered to a bottom ground surface of the high-efficiency amplifier body 44.

Figure 24:
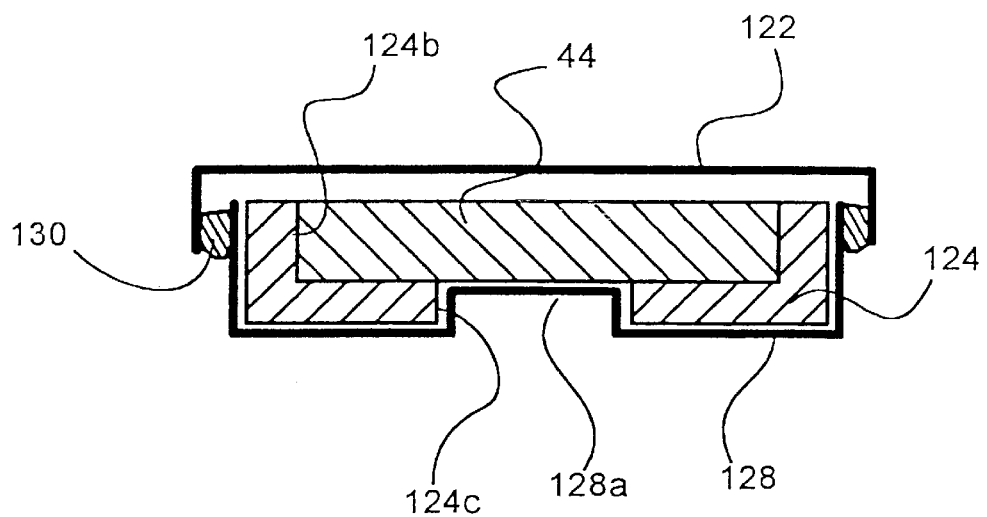
FIG. 24 is a cross-sectional view taken on line XXIV—XXIV of the composite element in FIG. 23.

FIG. 24 is a cross-sectional view taken on line XXIV—XXIV of the composite element in FIG. 23. The view shows the high-efficiency amplifier body 44 placed into the amplifier pocket 124b while the projection 128a of the lower yoke 128 is in contact with the bottom of the amplifier body 44 through the opening 124c.

The upper yoke 122 and lower yoke 128, both acting as a shield each, are bonded together by solder 130 to form a magnetic circuit on the isolator side.

Figure 25:
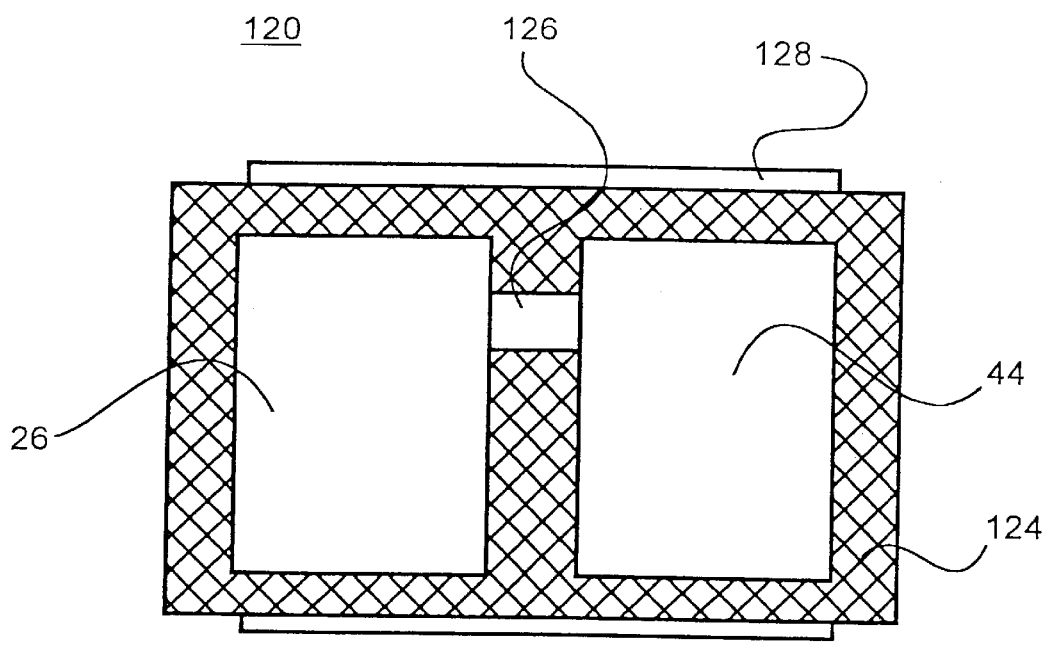
FIG. 25 is a plan view of the composite element in FIG. 23.

FIG. 25 is a plan view of the composite element in FIG. 23. This view illustrates the composite element taking off the upper yoke 122.

Figure 26:
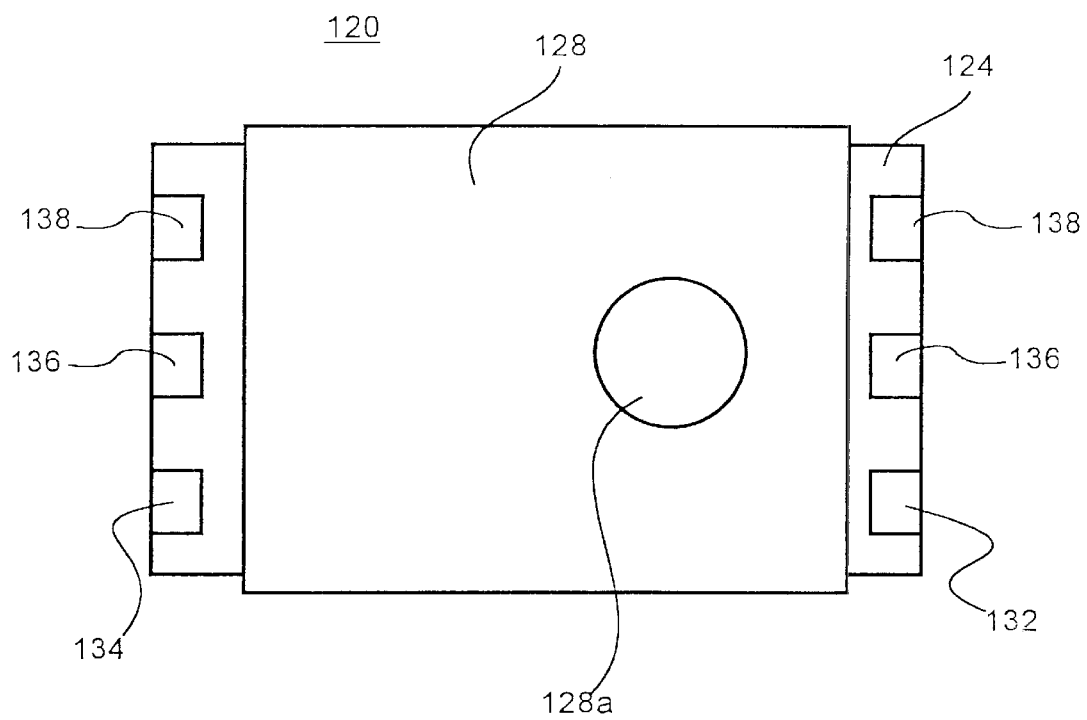
FIG. 26 is a bottom view of the composite element.

As seen in FIG. 25, the resin case 124 is made longer than the lower yoke 128; it protrudes from both sides of the lower yoke 128. FIG. 26 is a bottom view of the composite element 128.

In FIG. 26, reference numeral 132 stands for an input terminal of the composite element 120, and numeral 134 denotes an output terminal of the element 120. The input terminal 132 and output terminal 134, as well as ground terminals 136 and power supply terminals 138 positioned adjacent to the terminals 132 and 134, are furnished on those portions of the resin case 124 which protrude from the lower yoke 128.

The isolator body assembly 26 and high-efficiency amplifier body 44 are identical to those in the first embodiment. The upper yoke 122, resin case 124 and lower yoke 128 are basically the same as those in the first embodiment.

In the composite element 120 of the eleventh embodiment, the resin case required of the isolator is extended to accommodate both the isolator body assembly 26 and the high-efficiency amplifier body 44, and to which the transmission line 126 is attached. The absence of an element substrate makes the composite element thinner, simpler in structure, and less costly to manufacture than before.

The upper yoke 122, resin case 124 and lower yoke 128 are used as connective members that connect the isolator with the high-efficiency amplifier. The structure retains the flexural rigidity of the composite element and thereby enhances its mechanical reliability.

Twelfth Embodiment

A twelfth embodiment of the invention involves furnishing a coupled circuit to a transmission line connecting an isolator with a high-efficiency amplifier.

Figure 27:
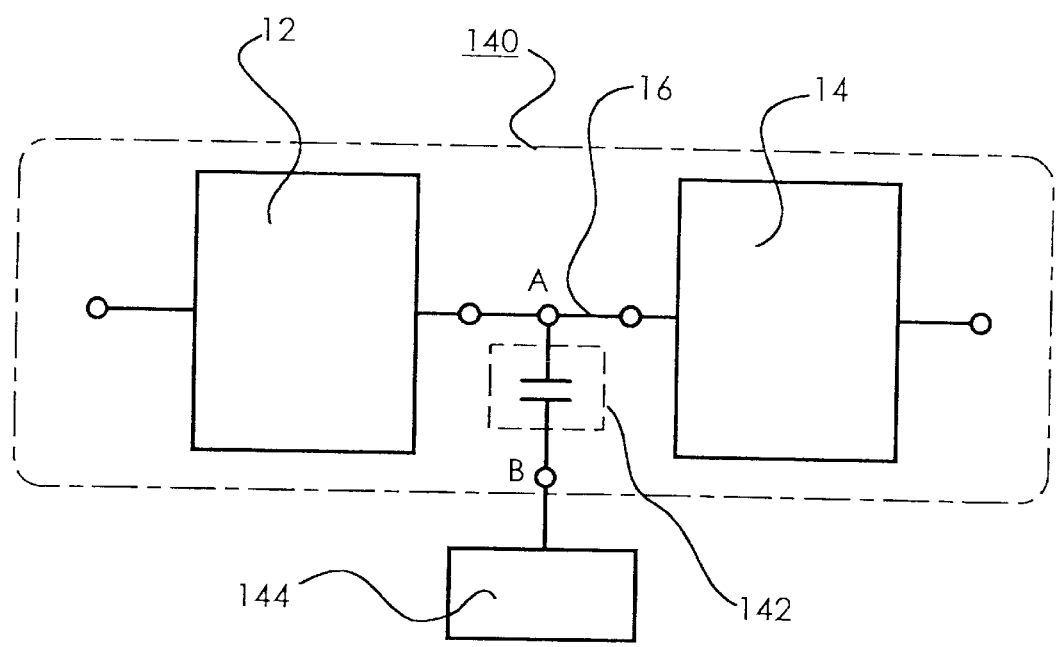
FIG. 27 is a circuit diagram of an equivalent circuit representing a composite element as another embodiment of the invention.
Figure 28:
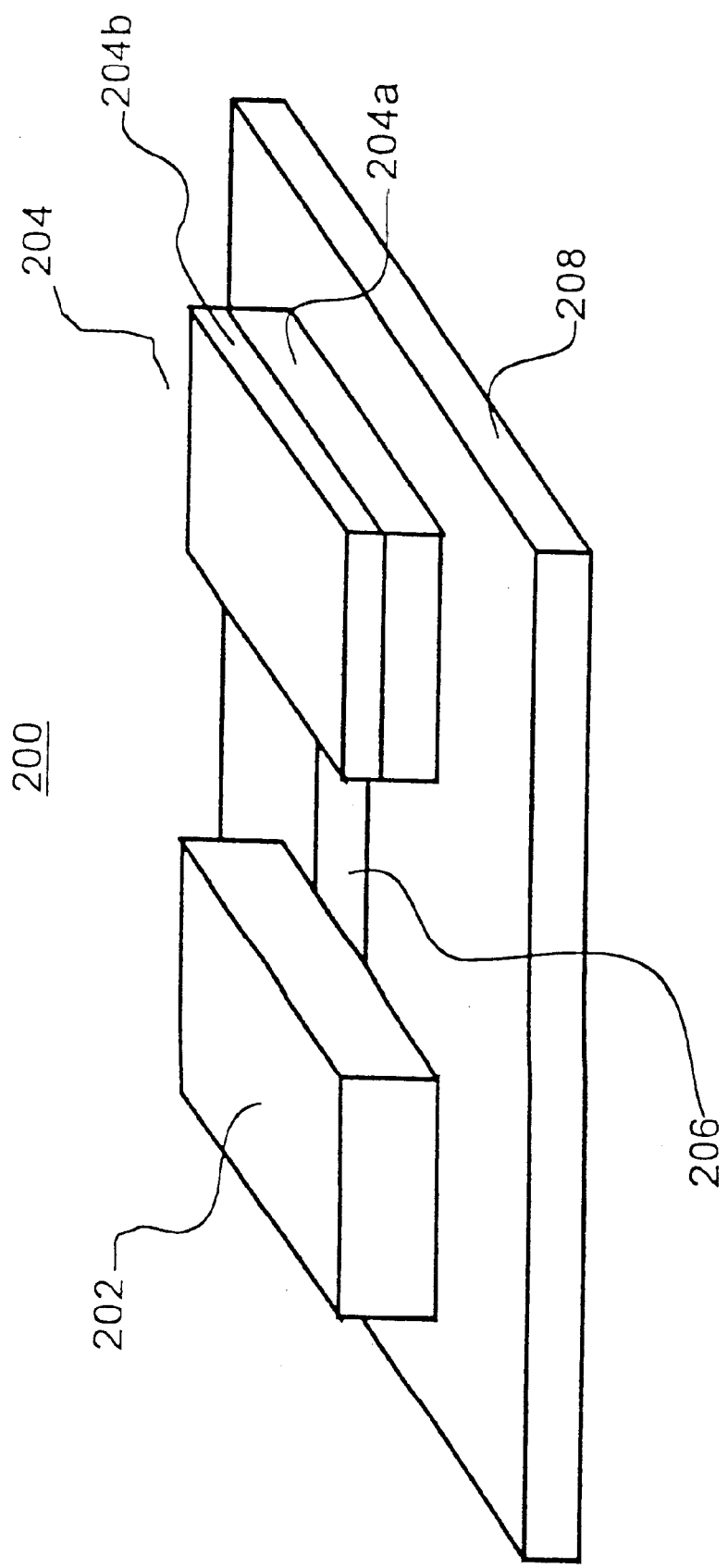
FIG. 28 is a schematic view of a conventional radio-frequency circuit device.

FIG. 27 is a circuit diagram of an equivalent circuit representing a composite element practiced as the twelfth embodiment of the invention.

In FIG. 27, reference numeral 140 denotes a composite element, and numeral 142 represents a capacitance that is attached to the composite element 140 as a coupled circuit. Specifically, the capacitance 142 is connected in parallel with a transmission line 16 at a node A. In practice, the capacitance 142 may be formed by two lines arranged in parallel or may be provided in the form of a chip component. A power metering circuit 144 is furnished illustratively as an external circuit to the composite element 140. The circuit 144 is connected to the capacitance 142 at a node B.

The composite element 140 of the twelfth embodiment may be practiced by having a capacitor attached to composite elements between the first embodiment and the eleventh embodiment of this invention.

In the composite element 140 of the twelfth embodiment, a predetermined proportion of power transmitted from the high-efficiency amplifier 14 to the isolator 12 is output from the node B. The power thus tapped is metered by the power metering circuit 144 to monitor the amount of power output by the high-efficiency amplifier 14.

The embodiments above have been described on the assumption that the impedance of the transmission line is less than 50 ohms. Alternatively, the impedance may be set to 50 ohms and the same benefits of the invention are still available.

In brief, the inventive radio-frequency composite element of the above-described constitution offers the following major effects:

According to one aspect of the invention, there is provided a radio-frequency composite element comprising: an amplifying element constituted by a body made of a multilayer substrate and of a semiconductor element attached to the multilayer substrate, and by a cover covering the body; a nonreciprocal circuit element constituted by a body assembly made of a magnetic material, of a plurality of central electrodes surrounding the magnetic material while being isolated from one another, and of a magnet applying magnetic fields to the magnetic material and the central electrodes; and by a shield shielding the body assembly; and a first connective conductor for connecting an output terminal of the amplifying element with an input terminal of the nonreciprocal circuit element. This structure forms a small-sized amplifying element that is located adjacent to the nonreciprocal circuit element, the two components being held together in an integral fashion so that the resulting radio-frequency composite element is made thinner and smaller than ever.

In one preferred structure according to the invention, the first connective conductor may have a characteristic impedance of less than 50 ohms. This structure minimizes the possibility of impedance mismatch in forming a radio-frequency composite element that offers a highly efficient transmission capability.

In another preferred structure according to the invention, the radio-frequency composite element may further comprise a dielectric substrate to which the first connective conductor is attached as a transmission line, wherein the amplifying element and the nonreciprocal circuit element are bonded integrally onto the dielectric substrate. This provides a simply structured, compact radio-frequency composite element.

In a further preferred structure according to the invention, the cover of the amplifying element and the shield of the nonreciprocal circuit element may be integrally formed.

This structure is intended to make the radio-frequency composite element thinner while maintaining flexural rigidity and thus ensuring mechanical reliability of the element.

In an even further preferred structure according to the invention, the dielectric substrate may have a concave portion in which to embed a body part or a body assembly part, including a bottom, of either the nonreciprocal circuit element or the amplifying element, or of both the nonreciprocal circuit element and the amplifying element. This structure renders the radio-frequency composite element thinner than ever.

In a still further preferred structure according to the invention, the dielectric substrate may carry resin layers in which to embed both the nonreciprocal circuit element and the amplifying element. This structure is designed to make the radio-frequency composite element thinner than ever while improving its flexural rigidity. The result is a thin-shaped radio-frequency composite element with enhanced mechanical reliability.

In a yet further preferred structure according to the invention, the dielectric substrate may be attached laterally to the nonreciprocal circuit element and to the amplifying element. The structure allows the radio-frequency composite element to be made as low in height as either the nonreciprocal circuit element or the amplifying element.

In another preferred structure according to the invention, the radio-frequency composite element may further comprise a plurality of dielectric substrates attached to tops and bottoms of the nonreciprocal circuit element and the amplifying element, wherein either the top or the bottom dielectric substrate comprises a transmission line. This structure makes the radio-frequency composite element thinner than ever while keeping its flexural rigidity. The thin-shaped element offers high mechanical reliability.

In a further preferred structure according to the invention, the transmission line may be made of a triplet strip line. This structure contributes to narrowing the transmission line and thereby implementing a small-sized radio-frequency composite element.

In an even further preferred structure according to the invention, the input terminal of the nonreciprocal circuit element and the first connective conductor may be integrally formed. By directly connecting the input terminal of the nonreciprocal circuit element to the output terminal of the amplifying element, this structure eliminates the need for an element substrate and thus helps render the radio-frequency composite element smaller, thinner and less costly to manufacture than before.

In a still further preferred structure according to the invention, the radio-frequency composite element may comprise a plurality of first connective conductors. This structure boosts mechanical strength in connecting the nonreciprocal circuit element with the amplifying element and thus constitutes a radio-frequency composite element with enhanced mechanical reliability.

In a yet further preferred structure according to the invention, the radio-frequency composite element may further comprise a resin structure which the body assembly of the nonreciprocal circuit element is held, wherein the resin structure is extended in the direction of the amplifying element and holds the body of the amplifying element. This structure is designed to make the radio-frequency composite element smaller and thinner than ever while improving its flexural rigidity. The result is a small-sized, thin-shaped radio-frequency composite element that promises enhanced mechanical reliability even as it is simplified in structure and inexpensive to fabricate.

In another preferred structure according to the invention, the nonreciprocal circuit element may be made of an isolator. This structure provides a compact radio-frequency composite element that combines the amplifying element with the isolator.

In a further preferred structure according to the invention, the nonreciprocal circuit element may be made of a circulator, and the radio-frequency composite element may further comprise a terminating resistor and a second connective conductor for connecting the terminating resistor with the circulator. This structure provides a compact radio-frequency composite element that combines the amplifying element with the circulator.

In an even further preferred structure according to the invention, the terminating resistor may have a cooling edge that is in contact with the shield. This structure provides a radio-frequency composite element that has an excellent heat dissipation characteristic.

In a still further preferred structure according to the invention, the radio-frequency composite element may further comprise a detection circuit connected to the second connective conductor. This structure provides a radio-frequency composite element capable of metering reflected power.

In a yet further preferred structure according to the invention, the radio-frequency composite element may further comprise a coupled circuit connected to the first connective conductor. This structure provides a radio-frequency composite element capable of having its output monitored.

While the presently preferred embodiments of the present invention have been shown and described. It is to be understood these disclosures are for the purpose of illustration and that various changes and modifications may be made without departing from the scope of the invention as set forth in the appended claims.

The entire disclosure of a Japanese Patent Application No. 2000-197554, filed on Jun. 30, 2000 including specification, claims, drawings and summary, on which the Convention priority of the present application is based, are incorporated herein by reference in its entirety.

What is claimed is:

1. A radio-frequency composite element comprising: an amplifying element having a characteristic impedance and including a body having a multilayer substrate, a semiconductor element attached to the multilayer substrate, and a cover covering the body;

a nonreciprocal circuit element having a characteristic impedance and comprising a body assembly, an input terminal, and a shield shielding the body assembly;

a first connective conductor connecting an output terminal of said amplifying element to the input terminal of said nonreciprocal circuit element, having a characteristic impedance less than 50 ohms, and matching the characteristic impedance of said amplifying element to the characteristic impedance of said nonreciprocal circuit element; and a dielectric substrate to which said first connective conductor is attached as a transmission line and on which said amplifying element and said nonreciprocal circuit element are located adjacent to each other and connected through said first connective conductor, said dielectric substrate being mountable on a circuit substrate.

2. The radio-frequency composite element according to claim 1, including a circuit substrate on which said dielectric substrate is mounted.

3. The radio-frequency composite element according to claim 1, further comprising a coupled circuit connected to said first connective conductor.

4. The radio-frequency composite element according to claim 1, wherein said nonreciprocal circuit element is an isolator.

5. The radio-frequency composite element according to claim 1, wherein said cover of said amplifying element and said shield of said nonreciprocal circuit element are integral.

6. The radio-frequency composite element according to claim 1, wherein the dielectric substrate has a concave portion in which at least one of a body part and a body assembly part may be embedded, including a bottom, of at least one of said nonreciprocal circuit element and said amplifying element.

7. The radio-frequency composite element according to claim 1, wherein said dielectric substrate includes resin layers embedding both said nonreciprocal circuit element and said amplifying element.

8. The radio-frequency composite element according to claim 1, wherein said dielectric substrate is attached laterally to said nonreciprocal circuit element and to said amplifying element.

9. The radio-frequency composite element according to claim 1, comprising a plurality of dielectric substrates attached to tops and bottoms of said nonreciprocal circuit element and said amplifying element, wherein one of a top and a bottom dielectric substrate comprises a transmission line.

10. The radio-frequency composite element according to claim 1, wherein said transmission line is a triplet strip line.

11. The radio-frequency composite element according to claim 1, wherein said input terminal of said nonreciprocal circuit element and said first connective conductor are integral.

12. The radio-frequency composite element according to claim 11, comprising a plurality of said first connective conductors.

13. The radio-frequency composite element according to claim 1, further comprising a resin structure in which said body assembly of said nonreciprocal circuit element is held, wherein said resin structure extends toward said amplifying element and holds the body of said amplifying element.

14. The radio-frequency composite element according to claim 1, wherein said nonreciprocal circuit element is a circulator, and said radio-frequency composite element comprises a terminating resistor and a second connective conductor for connecting said terminating resistor to said circulator.

15. The radio-frequency composite element according to claim 14, wherein said terminating resistor has a cooling edge in contact with said shield.

16. The radio-frequency composite element according to claim 14, further comprising a detection circuit connected to said second connective conductor.

* * * * *